United States Patent
Jung et al.

(10) Patent No.: US 10,910,279 B2
(45) Date of Patent: Feb. 2, 2021

(54) VARIABLE RESISTANCE MEMORY DEVICES

(71) Applicant: SAMSUNG ELECTRONICS CO., LTD., Suwon-si (KR)

(72) Inventors: You-Jin Jung, Hwaseong-si (KR); Masayuki Terai, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/560,516

(22) Filed: Sep. 4, 2019

(65) Prior Publication Data

US 2020/0243764 A1    Jul. 30, 2020

(30) Foreign Application Priority Data

Jan. 25, 2019  (KR) .................. 10-2019-0010087

(51) Int. Cl.
| | | |
|---|---|---|
| *H01L 21/82* | (2006.01) | |
| *H01L 21/8239* | (2006.01) | |
| *H01L 45/00* | (2006.01) | |
| *H01L 21/8229* | (2006.01) | |

(52) U.S. Cl.
CPC ...... *H01L 21/8239* (2013.01); *H01L 21/8229* (2013.01); *H01L 45/1675* (2013.01)

(58) Field of Classification Search
CPC ............. H01L 21/8239; H01L 21/8229; H01L 45/1253; H01L 45/141; H01L 45/144; H01L 45/1233

See application file for complete search history.

(56) References Cited

U.S. PATENT DOCUMENTS

| | | | |
|---|---|---|---|
| 7,723,820 B2 | 5/2010 | Kim et al. | |
| 7,781,805 B2 | 8/2010 | Yang et al. | |
| 8,058,636 B2 * | 11/2011 | Osano | H01L 27/101 257/2 |
| 8,154,005 B2 | 4/2012 | Hsia et al. | |
| 8,274,067 B2 | 9/2012 | Ahn et al. | |
| 8,569,734 B2 | 10/2013 | Redaelli et al. | |
| 8,687,408 B2 | 4/2014 | Kwon | |
| 9,123,392 B1 * | 9/2015 | Yan | H01L 27/249 |
| 9,147,840 B2 | 9/2015 | Knobloch et al. | |
| 9,263,218 B2 * | 2/2016 | Holzmann | G11C 13/0002 |
| 9,917,090 B1 * | 3/2018 | Cheng | H01L 21/823412 |
| 10,083,877 B1 * | 9/2018 | Sano | H01L 29/78642 |
| 2008/0304308 A1 * | 12/2008 | Stipe | H01L 27/2481 365/51 |
| 2009/0180313 A1 | 7/2009 | Deweerd et al. | |
| 2013/0140515 A1 * | 6/2013 | Kawashima | H01L 45/085 257/4 |

(Continued)

*Primary Examiner* — William Coleman
(74) *Attorney, Agent, or Firm* — Sughrue Mion, PLLC

(57) ABSTRACT

A variable resistance memory device includes a memory unit including a first electrode, a variable resistance pattern and a second electrode sequentially stacked on a substrate, a first selection structure on the memory unit, a third electrode structure on the first selection structure, and an anti-fuse including a fourth electrode, a second selection structure and a fifth electrode structure sequentially stacked. The fourth electrode directly contacts the second selection structure, and a bottom of the fourth electrode is lower than a bottom of the second electrode.

20 Claims, 45 Drawing Sheets

(56) References Cited

U.S. PATENT DOCUMENTS

| | | | |
|---|---|---|---|
| 2013/0240823 A1* | 9/2013 | Kwon | H01L 45/1253 257/4 |
| 2014/0061572 A1* | 3/2014 | Cho | H01L 27/228 257/4 |
| 2015/0279479 A1 | 10/2015 | Li et al. | |
| 2018/0211913 A1 | 7/2018 | Lee | |

\* cited by examiner

VARIABLE RESISTANCE MEMORY DEVICES

CROSS-REFERENCE TO RELATED APPLICATION

This application claims priority under 35 USC § 119 to Korean Patent Application No. 10-2019-0010087, filed on Jan. 25, 2019, in the Korean Intellectual Property Office (KIPO), the contents of which are herein incorporated by reference in their entirety.

BACKGROUND

1. Field

Example embodiments relate to a variable resistance memory device.

2. Description of the Related Art

In a PRAM device, an anti-fuse may be formed as a capacitor. That is, the anti-fuse may be implemented by applying a high voltage to a circuit to cause the breakdown of molecular binding of a dielectric layer included in the capacitor so that current paths may be formed. However, the anti-fuse may be formed in a peripheral circuit region so that the area of the PRAM device may increase.

SUMMARY

Example embodiments provide a variable resistance memory device having improved characteristics.

Example embodiments provide a method of manufacturing a variable resistance memory device having improved characteristics.

According to an aspect of an embodiment, there is provided a variable resistance memory device. The variable resistance memory device may include a memory unit including a first electrode, a variable resistance pattern and a second electrode sequentially stacked on a substrate, a first selection structure on the memory unit, a third electrode structure on the first selection structure, and an anti-fuse including a fourth electrode, a second selection structure and a fifth electrode structure sequentially stacked. The fourth electrode may directly contact the second selection structure, and a bottom of the fourth electrode may be lower than a bottom of the second electrode.

According to an aspect of an embodiment, there is provided a variable resistance memory device. The variable resistance memory device may include a memory unit including a first electrode, a variable resistance pattern and a second electrode sequentially stacked on a substrate, a first selection structure on the memory unit, a third electrode structure on the first selection structure, and an anti-fuse. The anti-fuse may include a fourth electrode having a U-shape cross-section on the substrate, a second selection structure directly contacting each of uppermost surfaces of the fourth electrode, and a fifth electrode structure on the second selection structure.

According to an aspect of an embodiment, there is provided a variable resistance memory device. The variable resistance memory device may include first conductive lines, second conductive lines, memory units, a first selection structure, a third electrode structure, and an anti-fuse on a substrate. Each of the first conductive lines may extend in a first direction substantially parallel to an upper surface of the substrate, and the conductive lines may be disposed in a second direction substantially parallel to the upper surface of the substrate and crossing the first direction. Each of the second conductive lines may extend in the second direction, and the second conductive lines may be disposed in the first direction over the first conductive lines. The memory units may be formed at first regions, respectively, among regions between the first and second conductive lines at which the first and second conductive lines overlap with each other in a third direction substantially perpendicular to an upper surface of the substrate. Each of the memory units may include a first electrode, a variable resistance pattern and a second electrode sequentially stacked. The first selection structure may be formed on each of the memory units. The third electrode structure may be formed on the first selection structure. Then anti-fuse may be formed at a second region among the regions, and may include a fourth electrode, a second selection structure and a fifth electrode structure sequentially stacked. A length of the fourth electrode in the third direction may be greater than a length of the first electrode in the third direction.

In the variable resistance memory device in accordance with example embodiments, the anti-fuse conventionally formed in the peripheral circuit region may be formed in the cell region, and thus the increase of the area of the variable resistance memory device may be prevented so that the variable resistance memory device may have enhanced integration degree. Additionally, the anti-fuse may be formed by skipping some elements during the formation of the memory unit, and thus easily formed to have a high capacity.

DESCRIPTION OF EMBODIMENTS

Example embodiments will be more clearly understood from the following detailed description taken in conjunction with the accompanying drawings.

FIGS. 1 to 30 are plan views and cross-sectional views illustrating steps of a method of manufacturing a variable resistance memory device in accordance with example embodiments. Specifically, FIGS. 1, 4, 8, 11, 14, 16, 19, 25 and 28 are plan views, and FIGS. 2-3, 5-7, 9-10, 12-13, 15, 17-18, 20-24, 26-27 and 29-30 are cross-sectional views. In more detail, FIGS. 2, 3, 5, 9, 12, 15, 17, 20, 22, 24, 26 and 29 are cross-sectional views taken along lines A-A' of corresponding plan views, respectively, and FIGS. 6, 7, 10, 13, 18, 21, 23, 27 and 30 are cross-sectional views taken along lines B-B' of corresponding plan views, respectively.

Hereinafter, two directions intersecting with each other among horizontal directions substantially parallel to an upper surface of a substrate are defined as first and second directions, respectively, and a vertical direction substantially perpendicular to the upper surface of the substrate is defined as a third direction. In example embodiments, the first and second directions may be orthogonal to each other.

Figure 1:
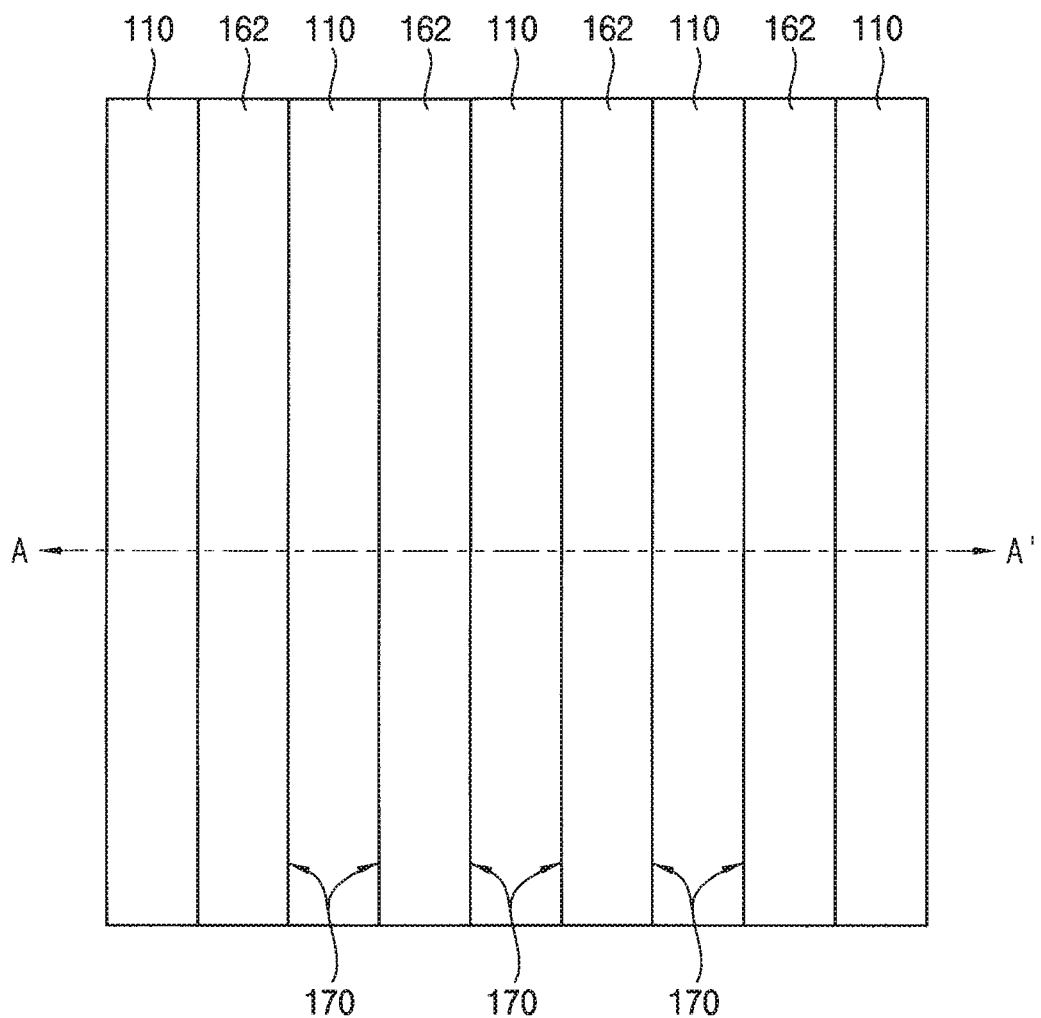
FIG. 1 is a plan view illustrating a method of manufacturing a variable resistance memory device in accordance with an embodiment.
Figure 2:
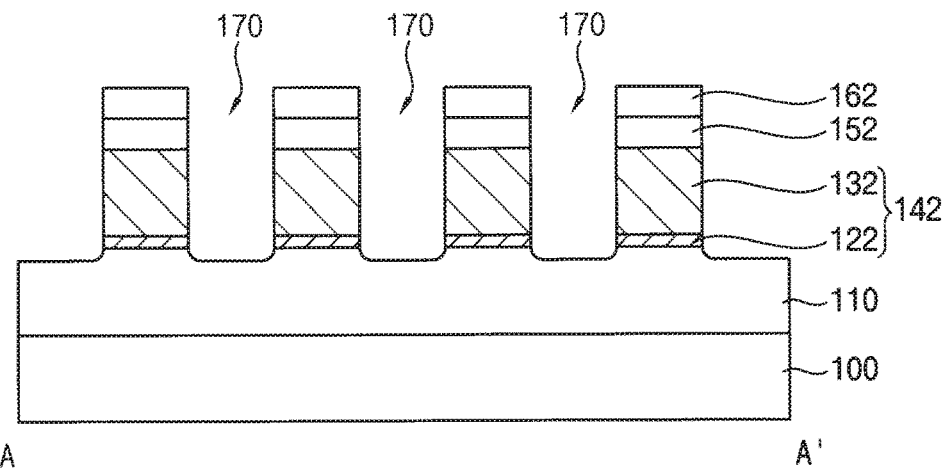
FIG. 2 is a cross-sectional view illustrating a method of manufacturing a variable resistance memory device in accordance with an embodiment.
Figure 2:
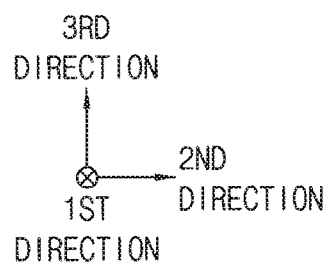

Referring to FIGS. 1 and 2, a first insulating interlayer 110 may be formed on a substrate 100, and a first structure including a first conductive line 142, an etch stop line 152, and a first etching mask 162 may be formed on the first insulating interlayer 110. The first conductive line 142, the etch stop line 152, and the first etching mask 162 may be formed to be sequentially stacked on the insulating interlayer 110.

The substrate 100 may include semiconductor materials, e.g., silicon, germanium, silicon-germanium, etc., or III-V compounds e.g., GaP, GaAs, GaSb, etc. In some embodiments, the substrate 100 may be a silicon-on-insulator (SOI) substrate or a germanium-on-insulator (GOI) substrate.

Various elements, e.g., a gate structure, a source/drain layer, a contact plug, a via, a wiring, etc., may be formed on the substrate 100, and may be covered by the first insulating interlayer 110. The first insulating interlayer 110 may include an oxide, e.g., a silicon oxide.

The first structure may be formed by sequentially stacking a first conductive layer and an etch stop layer on the first insulating interlayer 110, forming a first etching mask 162 on the etch stop layer, and etching the etch stop layer and the first conductive layer using the first etching mask 162.

In example embodiments, the first etching mask 162 may extend in the first direction, and thus each of the etch stop line 152 and the first conductive line 142 may also extend in the first direction. The first etching mask 162 may be formed by, e.g., a double patterning process.

The first structure may extend in the first direction, and a plurality of first structures may be formed in the second direction. A first opening 170 may be formed between neighboring first structures in the second direction to expose corresponding portions of an upper surface of the first insulating interlayer 110.

In example embodiments, the first conductive line 142 may include a first barrier line 122 and a first metal line 132. The first barrier line 122 and the first metal line 132 may be sequentially stacked on the first insulating interlayer 110. The first barrier line 122 may include a metal nitride or a metal silicon nitride, e.g., titanium nitride ($TiN_x$), titanium silicon nitride ($TiSiN_x$), tungsten nitride ($WN_x$), tungsten silicon nitride ($WSiN_x$), tantalum nitride ($TaN_x$), tantalum silicon nitride ($TaSiN_x$), etc., and the first metal line 132 may include a metal, e.g., tungsten (W), platinum (Pt), copper (Cu), aluminum (Al), titanium (Ti), tantalum (Ta), etc.

In example embodiments, the first conductive line 142 may serve as a word line of the variable resistance memory device. Alternatively, the first conductive line 142 may serve as a bit line.

The etch stop line 152 may include a nitride, e.g., silicon nitride, and the first etching mask 162 may include an oxide, e.g., silicon oxide.

Figure 3:
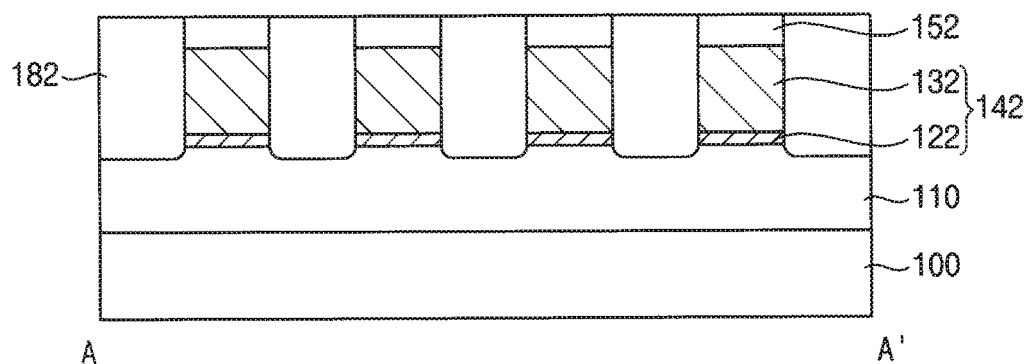
FIG. 3 is a cross-sectional view illustrating a method of manufacturing a variable resistance memory device in accordance with an embodiment.
Figure 3:
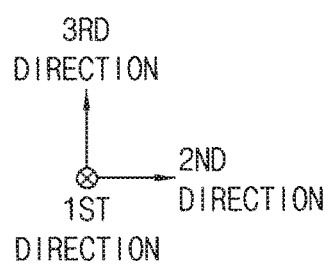

Referring to FIG. 3, a second insulating interlayer line 182 may be formed on the first insulating interlayer 110 to fill the first opening 170. The second insulating line 182 may be formed to fill each of the first openings 170.

The second insulating interlayer line 182 may be formed to form a second insulating interlayer on the first insulating interlayer 110 to fill the first opening 170 and cover the first structures, and planarizing an upper portion of the second insulating interlayer. Thus, the second insulating interlayer line 182 may extend in the first direction to cover a sidewall of the first structure, and a plurality of second insulating interlayer lines 182 may be space apart from each other by respective first structures in the second direction. The second insulating interlayer line 182 may include a nitride, e.g., silicon nitride.

The planarization process may include, e.g., a chemical mechanical polishing (CMP) process and/or an etch back process. During the planarization process, the first etching mask 162 of the first structure may be also removed, and thus an upper surface of the etch stop line 152 may be exposed.

Figure 4:
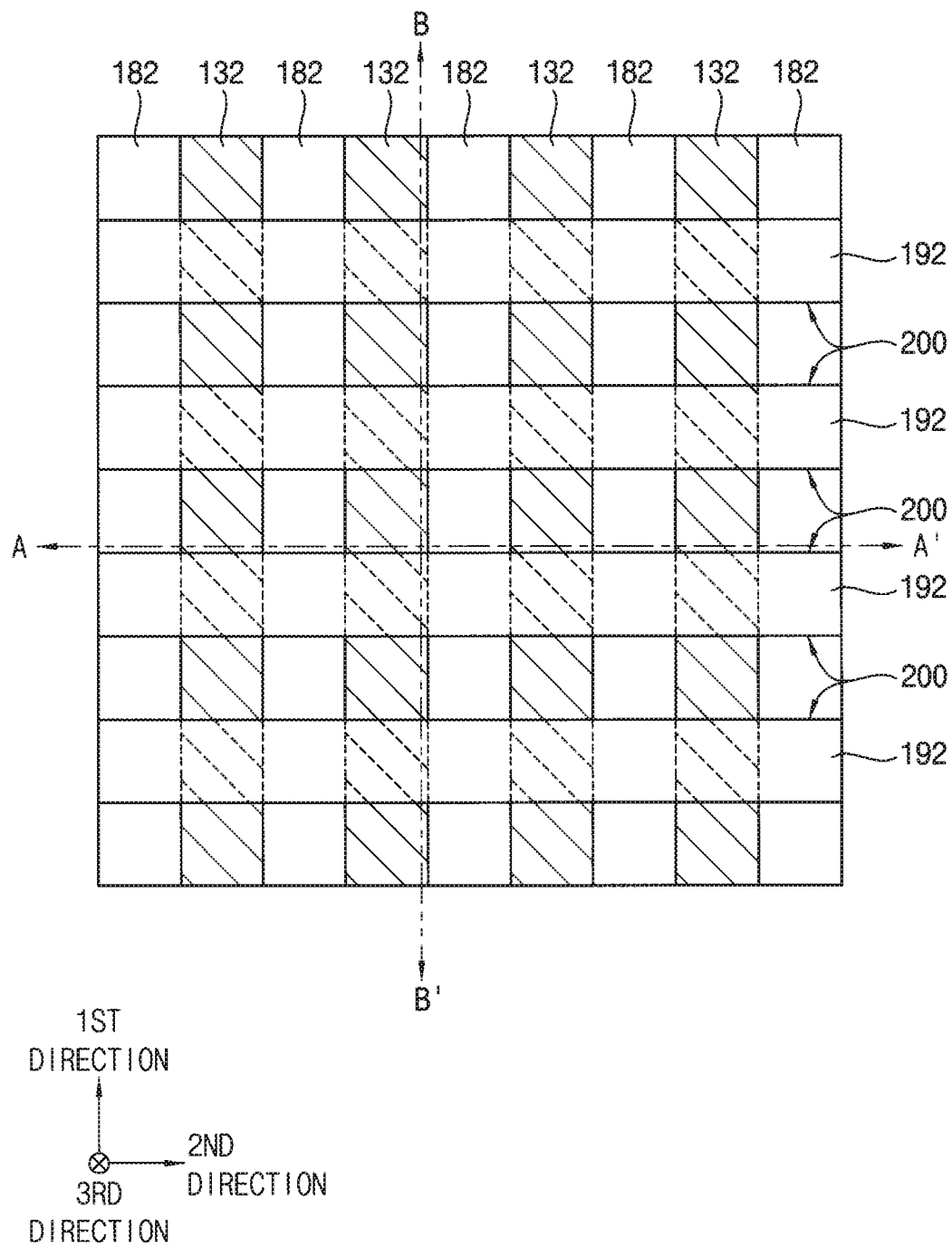
FIG. 4 is a plan view illustrating a method of manufacturing a variable resistance memory device in accordance with an embodiment.
Figure 5:
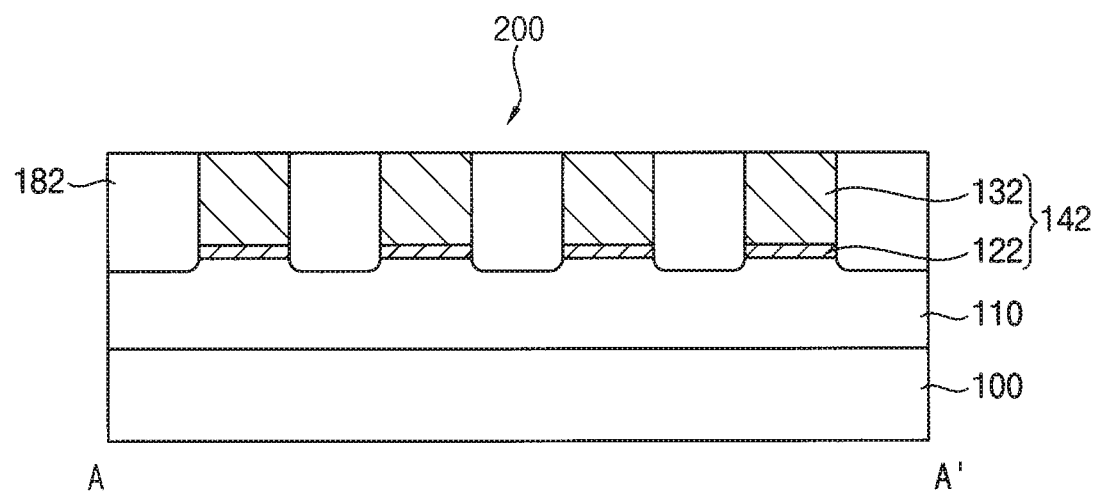
FIG. 5 is a cross-sectional view illustrating a method of manufacturing a variable resistance memory device in accordance with an embodiment.
Figure 5:
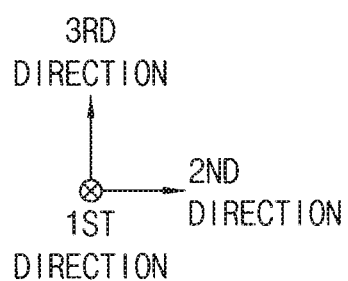
Figure 6:
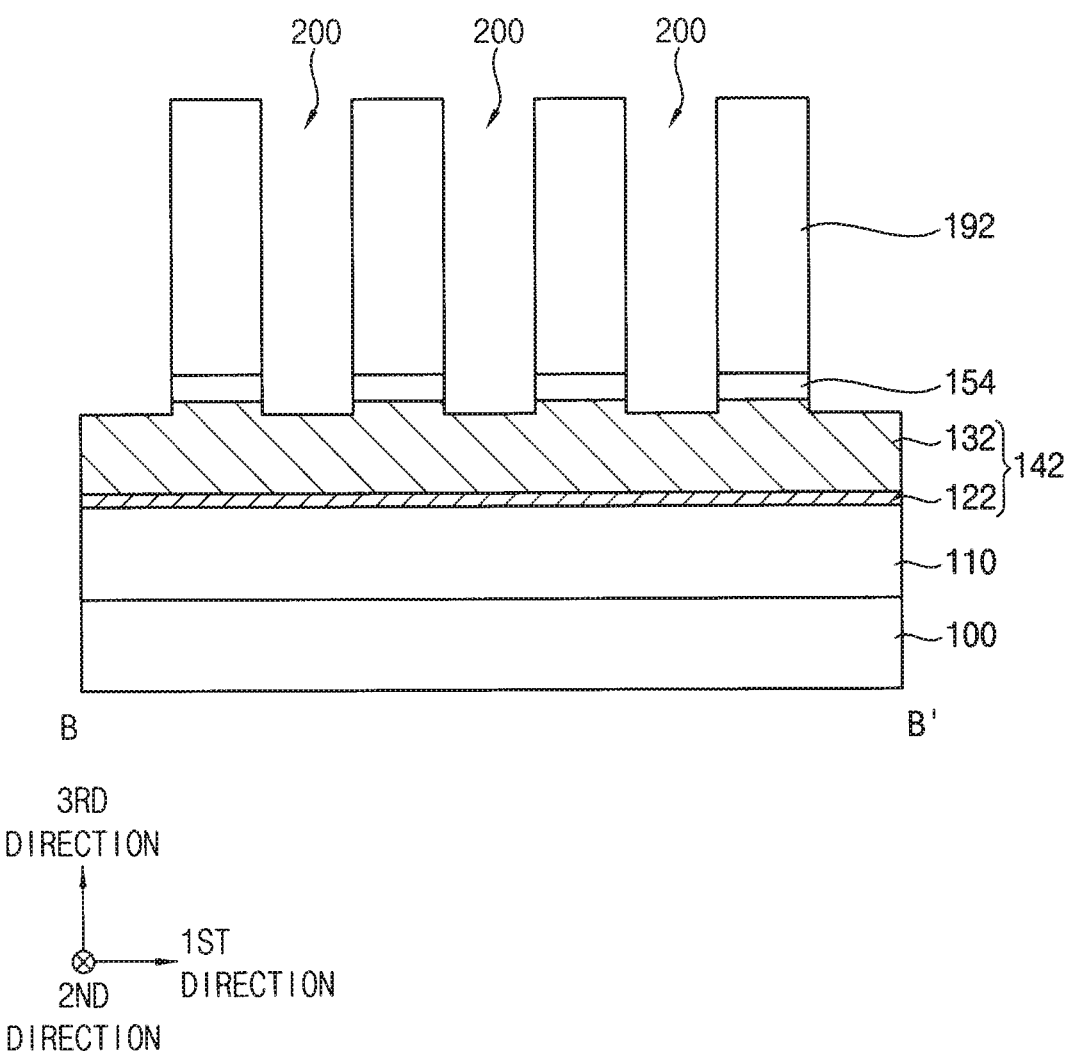
FIG. 6 is a cross-sectional view illustrating a method of manufacturing a variable resistance memory device in accordance with an embodiment.

Referring to FIGS. 4 to 6, a third insulating interlayer line 192 may be formed on the etch stop lines 152 and the second insulating interlayer lines 182, and the etch stop lines 152 and the second insulating interlayer lines 182 may be etched using the third insulating interlayer line 192 as an etching mask.

In example embodiments, the third insulating interlayer line 192 may extend in the second direction, and a plurality of third insulating interlayer lines 192 may be formed in the first direction. The etching process may be performed until an upper surface of the first conductive line 142 may be exposed, and during the etching process, an upper portion of the first conductive line 142 may be partially etched. The third insulating interlayer line 192 may include a nitride, e.g., silicon nitride.

As the etching process is performed, each of the etch stop lines 152 extending in the first direction may be transformed into a plurality of etch stop patterns 154 spaced apart from each other in the first direction, and an upper portion of each of the second insulating interlayer lines 182 may be partially removed. A second opening 200 may be formed between neighboring second structures each of which may include the etch stop pattern 154 and the third insulating interlayer line 192 sequentially stacked to extend in the second direction and expose upper surfaces of the first conductive lines 142 and the second insulating interlayer lines 182.

Figure 7:
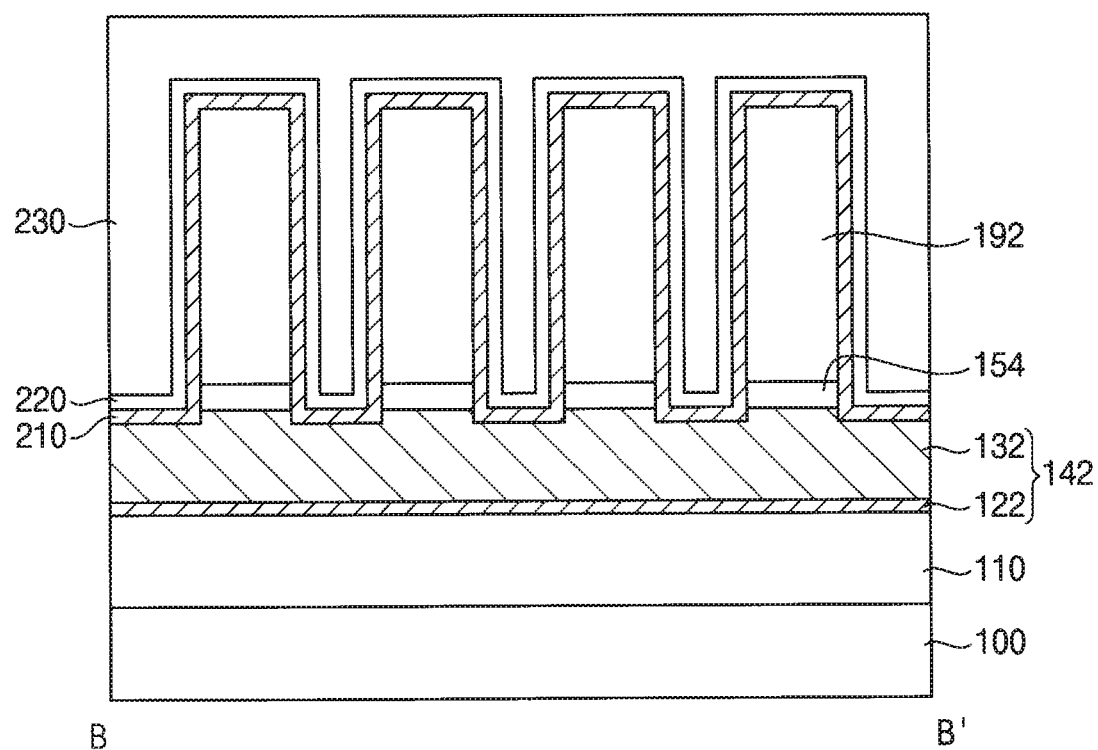
FIG. 7 is a cross-sectional view illustrating a method of manufacturing a variable resistance memory device in accordance with an embodiment.

Referring to FIG. 7, a first electrode layer 210 and a spacer layer 220 may be sequentially formed on a sidewall of the second opening 200, the exposed upper surfaces of the first conductive lines 142 and the second insulating interlayer lines 182, and upper surfaces of the third insulating interlayer lines 192, and a fourth insulating interlayer 230 may be formed on the spacer layer 220 to fill the second opening 200.

Each of the first electrode layer 210 and the spacer layer 220 may be formed by an atomic layer deposition (ALD) process or a chemical vapor deposition (CVD).

The first electrode layer 210 may include a metal nitride, e.g., titanium nitride, tungsten nitride, tantalum nitride, etc., or a metal silicon nitride, e.g., titanium silicon nitride, the spacer layer 220 may include an oxide, e.g., silicon oxide, and the fourth insulating interlayer 230 may include a nitride, e.g., silicon nitride.

Figure 8:
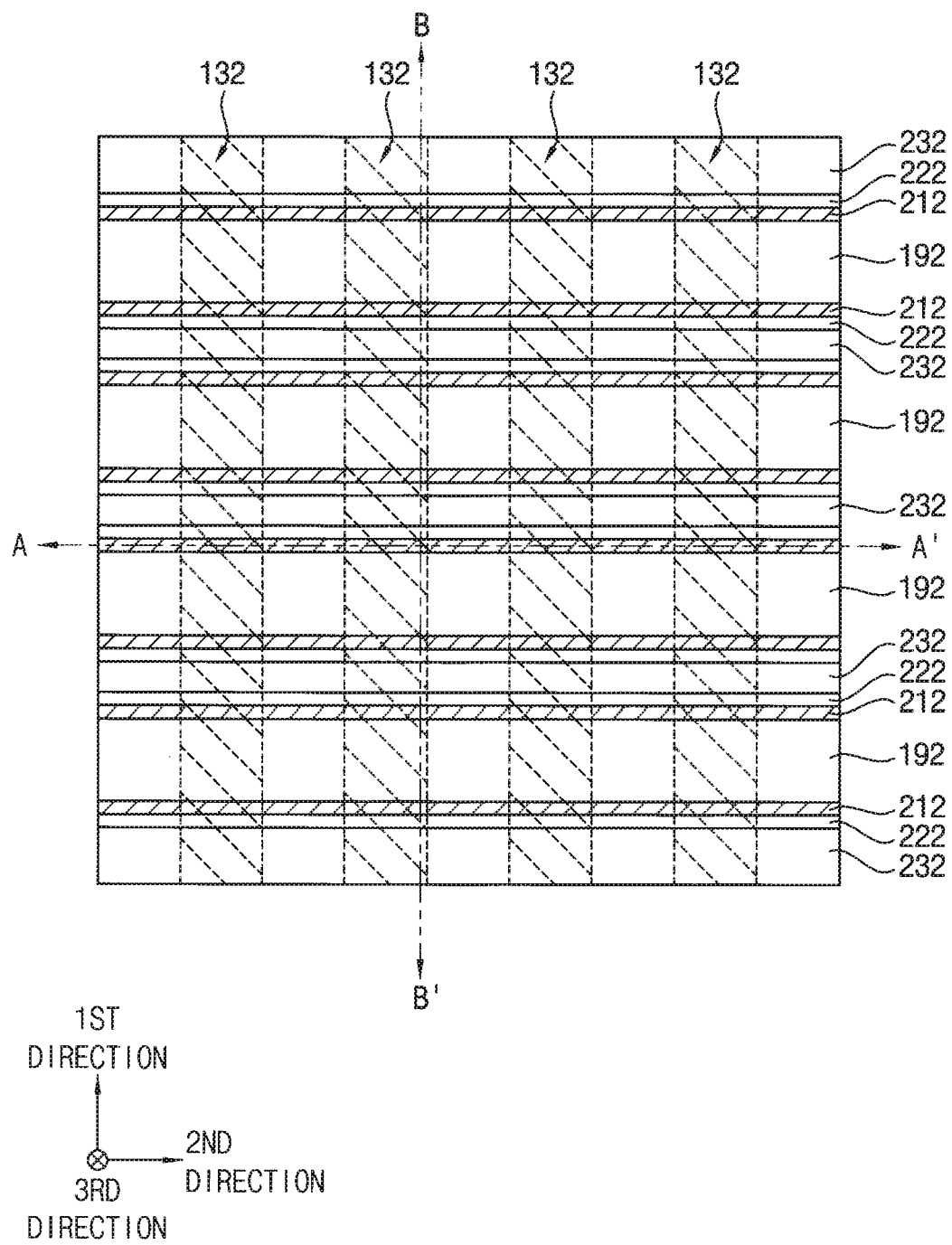
FIG. 8 is a plan view illustrating a method of manufacturing a variable resistance memory device in accordance with an embodiment.
Figure 9:
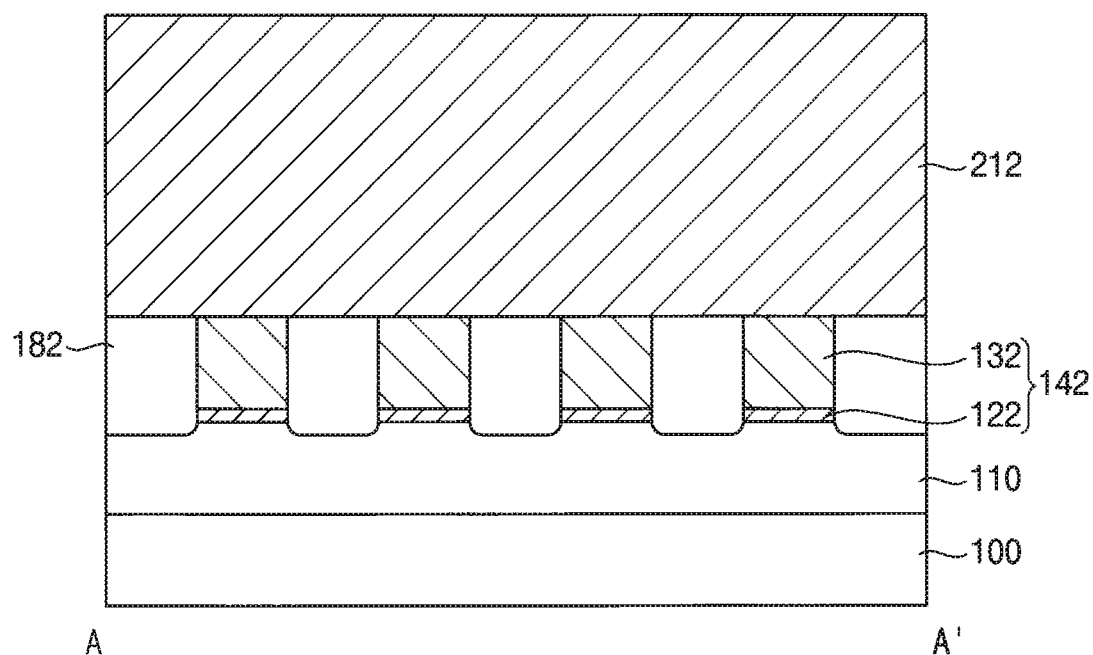
FIG. 9 is a cross-sectional view illustrating a method of manufacturing a variable resistance memory device in accordance with an embodiment.
Figure 10:
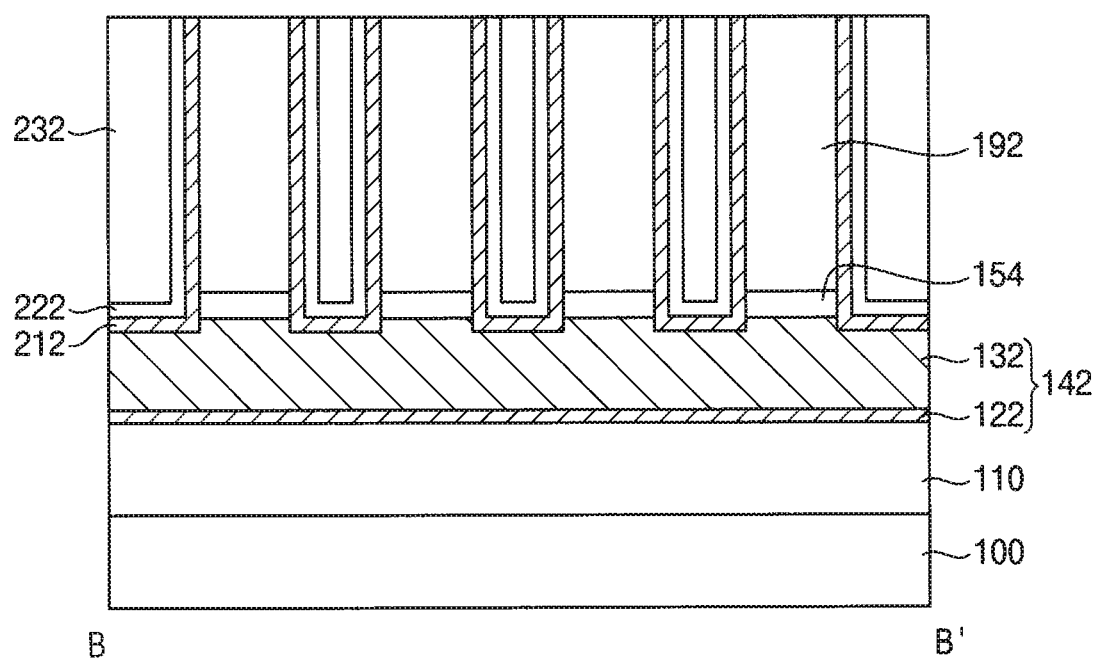
FIG. 10 is a cross-sectional view illustrating a method of manufacturing a variable resistance memory device in accordance with an embodiment.
Figure 10:
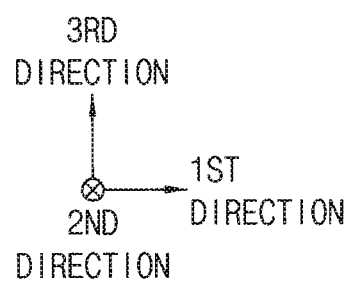

Referring to FIGS. 8 to 10, the fourth insulating interlayer 230, the spacer layer 220 and the first electrode layer 210 may be planarized until the upper surfaces of the third insulating interlayer lines 192 may be exposed, and thus a fourth insulating interlayer line 232, a spacer line 222 and a first electrode line 212, each of which may extend in the second direction, may be formed.

In example embodiments, the first electrode line 212 may be formed on the sidewall of the second opening 200 and the upper surfaces of the first conductive lines 142 and the second insulating interlayer lines 182, the spacer line 222 may be formed on the first electrode line 212, and the fourth insulating interlayer line 232 may be formed on the spacer line 222 to fill a remaining portion of the second opening 200. A plurality of first electrode lines 212, a plurality of spacer lines 222, and a plurality of fourth insulating interlayer lines 232 may be formed in the first direction.

Figure 11:
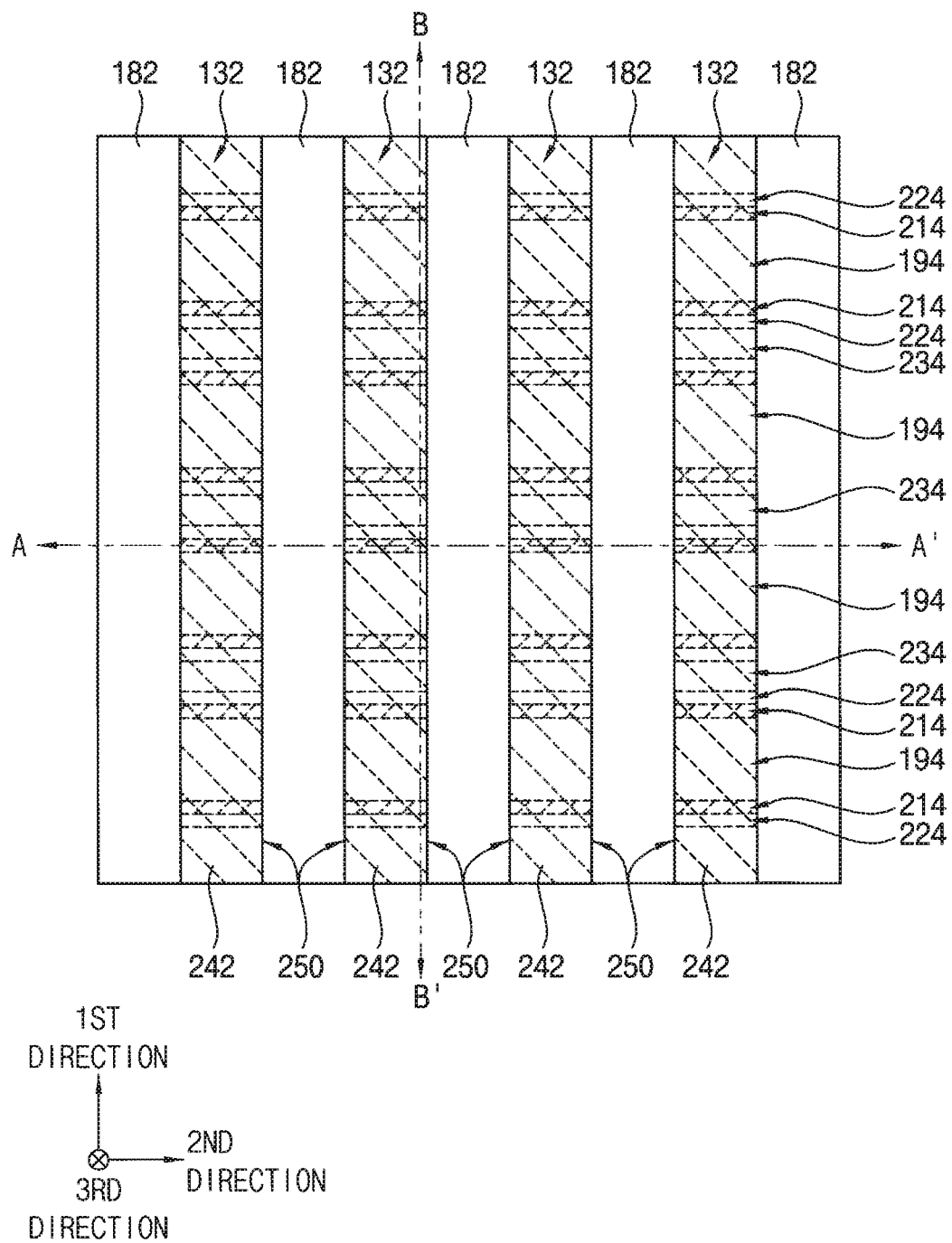
FIG. 11 is a plan view illustrating a method of manufacturing a variable resistance memory device in accordance with an embodiment.
Figure 12:
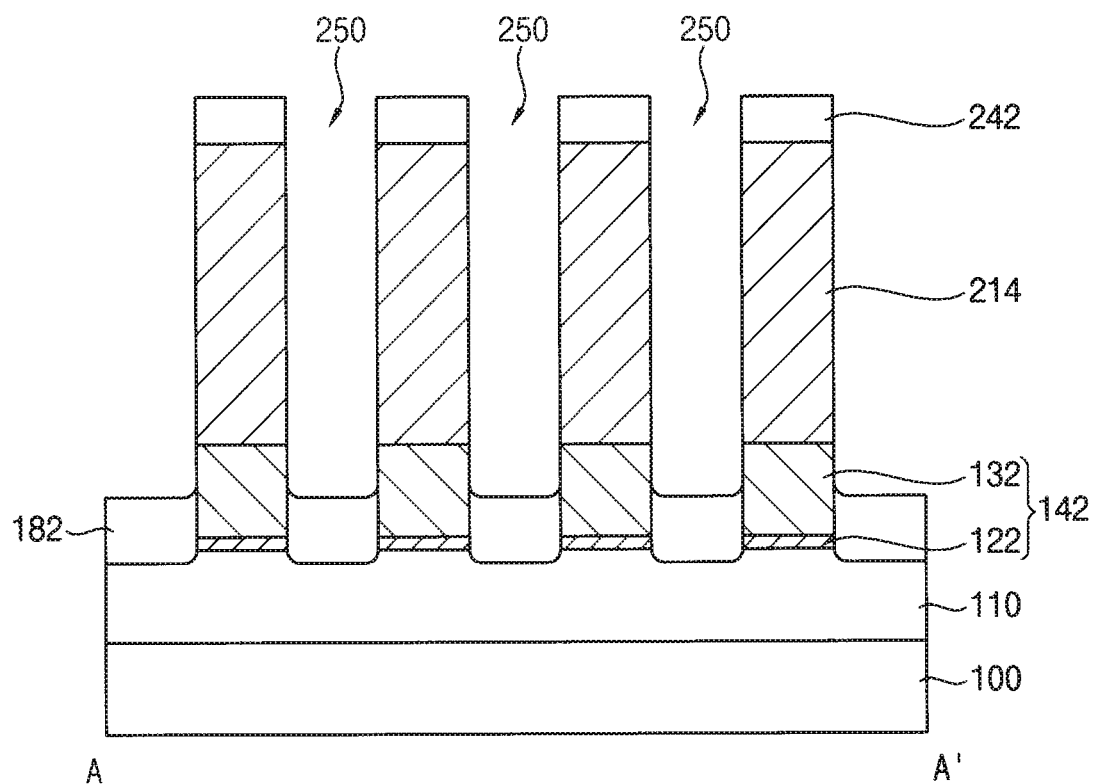
FIG. 12 is a cross-sectional view illustrating a method of manufacturing a variable resistance memory device in accordance with an embodiment.
Figure 13:
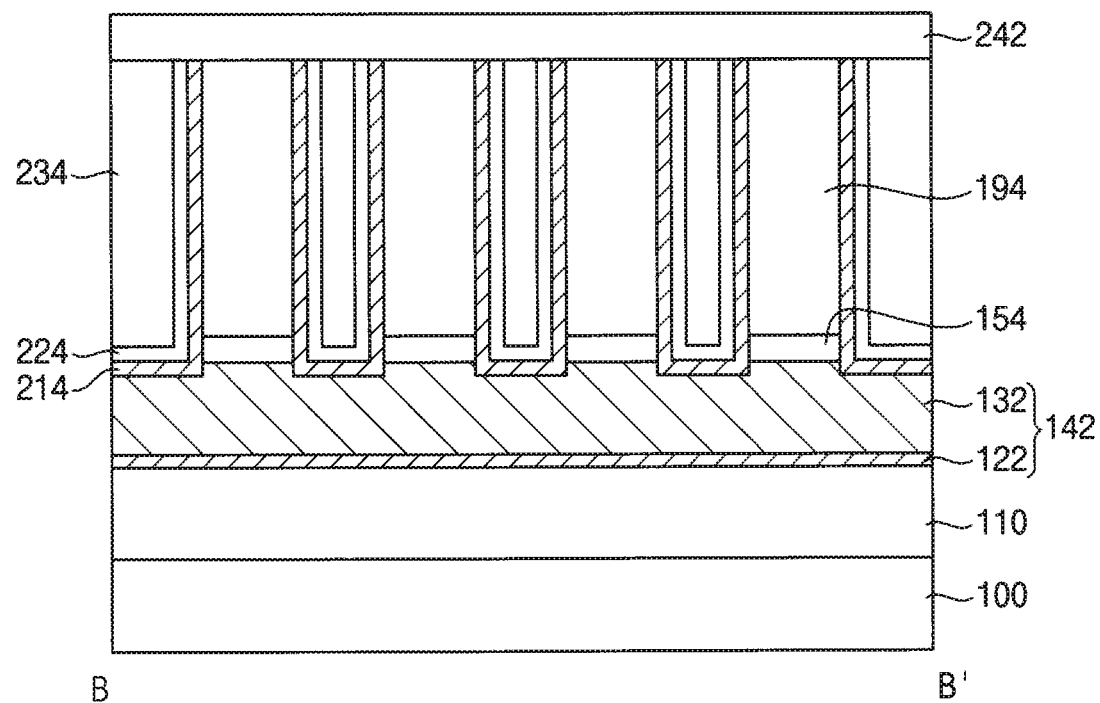
FIG. 13 is a cross-sectional view illustrating a method of manufacturing a variable resistance memory device in accordance with an embodiment.
Figure 13:
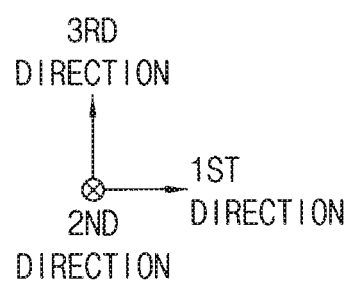

Referring to FIGS. 11 to 13, a second etching mask 242 may be formed on the fourth insulating interlayer line 232, the spacer line 222, the first electrode line 212 and the third insulating interlayer line 192, and the fourth insulating interlayer line 232, the spacer line 222, the first electrode line 212 and the third insulating interlayer line 192 may be etched using the second etching mask 242.

In example embodiments, the second etching mask 242 may extend in the first direction to overlap the first conductive line 142 in the third direction. A plurality of second etching masks 242 may be formed to be spaced apart from each other in the second direction. The second etching mask 242 may be formed by, e.g., a double patterning process. The etching process may be performed until the upper surface of the second insulating interlayer line 182 may be exposed, and an upper portion of the second insulating interlayer line 182 may be partially removed. The second etching mask 242 may include, e.g., polysilicon.

As the etching process is performed, the fourth insulating interlayer line 232, the spacer line 222, the first electrode line 212 and the third insulating interlayer line 192, each of which may extend in the second direction, may be transformed into a plurality of fourth insulating interlayer lines 232, a plurality of first spacers 224, a plurality of first electrodes 214 and a plurality of third insulating interlayer patterns 194, respectively, each of which may be spaced apart from each other in the second direction.

A third opening 250 may be formed between third structures each of which may include the third and fourth insulating interlayer patterns 194 and 234, the first spacer 224, the first electrode 214 and the second etching mask 242, and may extend in the first direction to expose the second insulating interlayer line 182.

Figure 14:
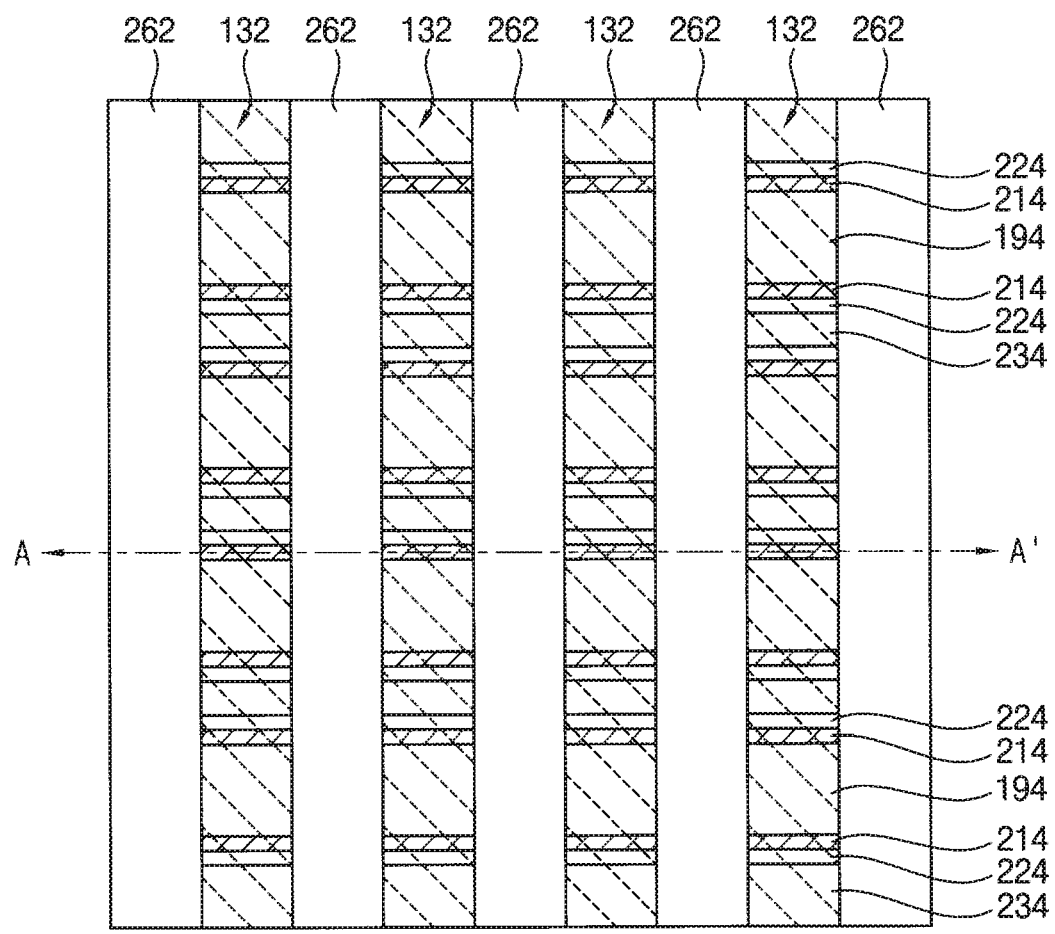
FIG. 14 is a plan view illustrating a method of manufacturing a variable resistance memory device in accordance with an embodiment.
Figure 15:
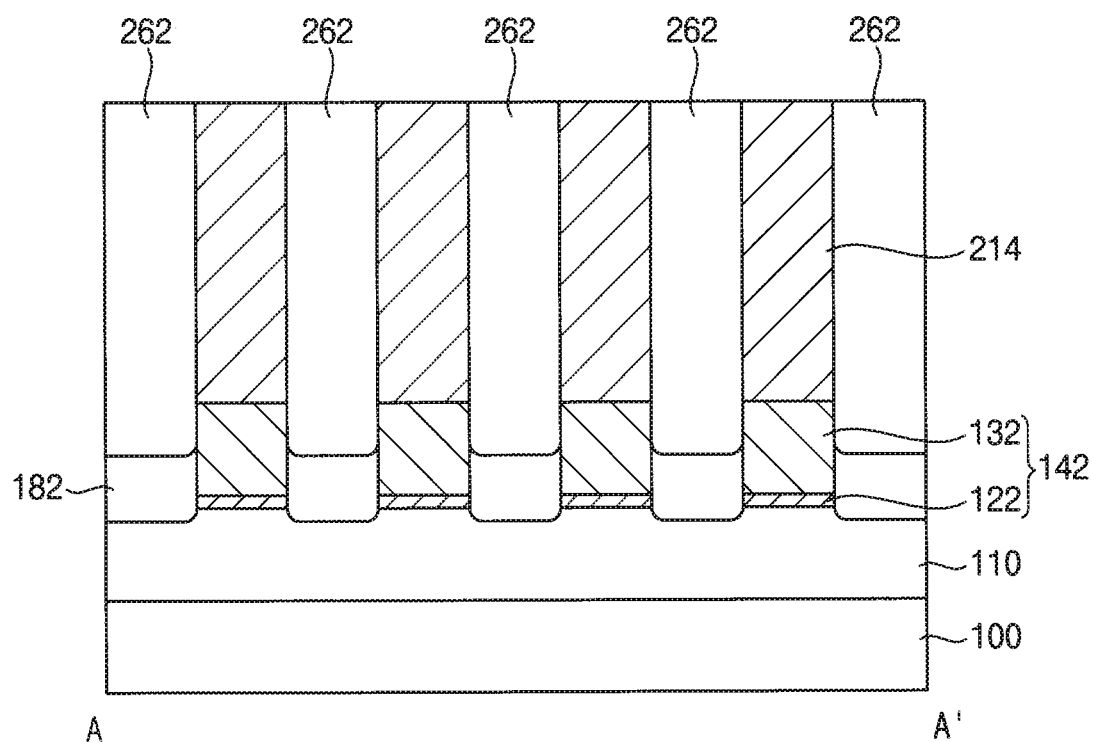
FIG. 15 is a cross-sectional view illustrating a method of manufacturing a variable resistance memory device in accordance with an embodiment.
Figure 15:
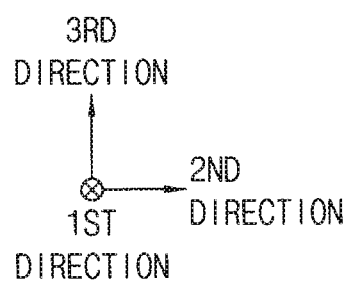

Referring to FIGS. 14 and 15, a fifth insulating interlayer line 262 may be formed to fill the third opening 250.

The fifth insulating interlayer line 262 may be formed by forming a fifth insulating interlayer to fill the third opening 250 and cover the third structures, and planarizing an upper portion of the fifth insulating interlayer until an upper surface of the first electrode 214 of the third structure may be exposed. The second etching mask 242 may be removed during the planarization process.

Thus, the fifth insulating interlayer line 262 may extend in the first direction to cover a sidewall of the third structure, and a plurality of fifth insulating interlayer lines 262 may be formed to be spaced apart from each other by the respective third structures in the second direction. The fifth insulating interlayer line 262 may include a nitride, e.g., silicon nitride.

Figure 16:
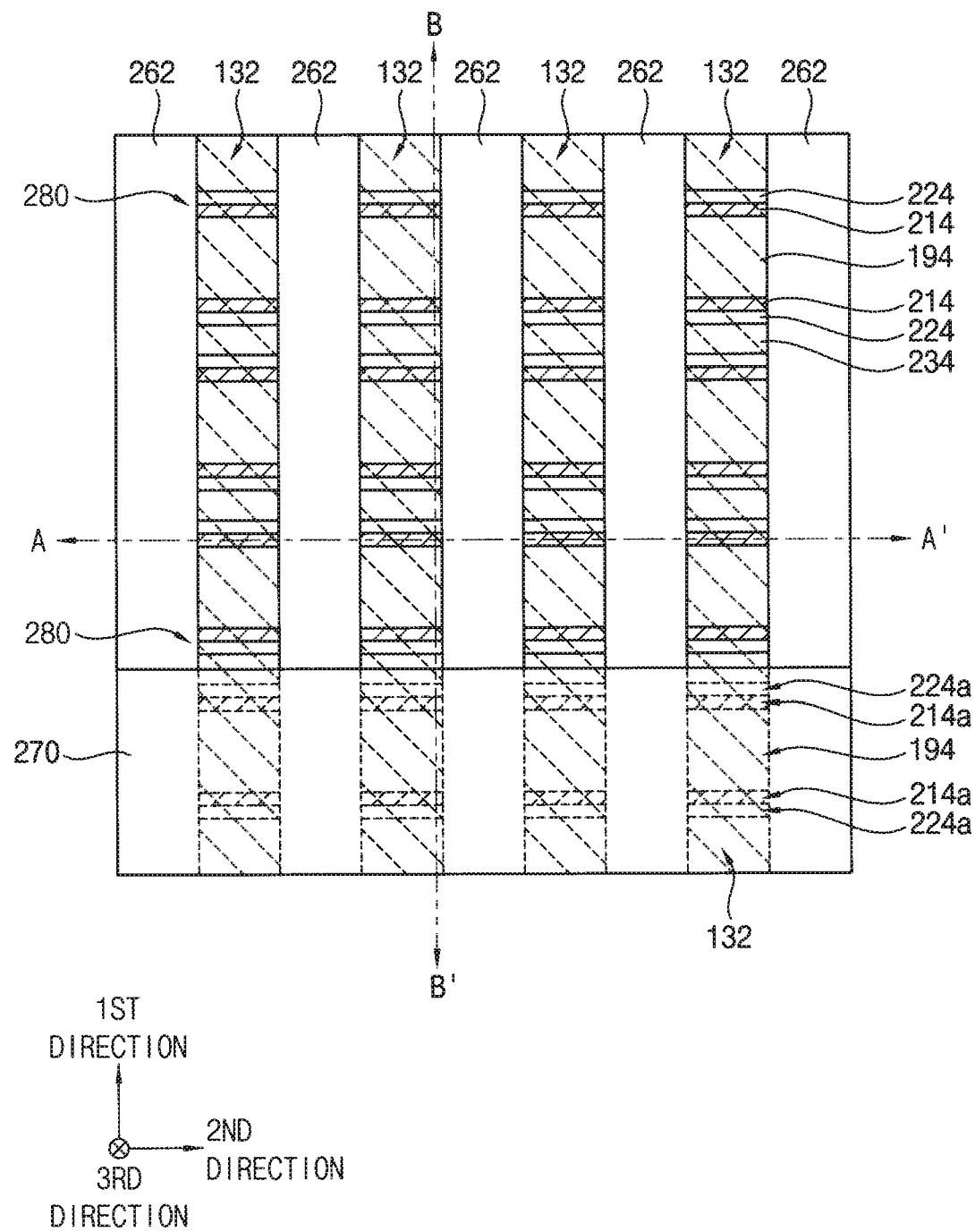
FIG. 16 is a plan view illustrating a method of manufacturing a variable resistance memory device in accordance with an embodiment.
Figure 17:
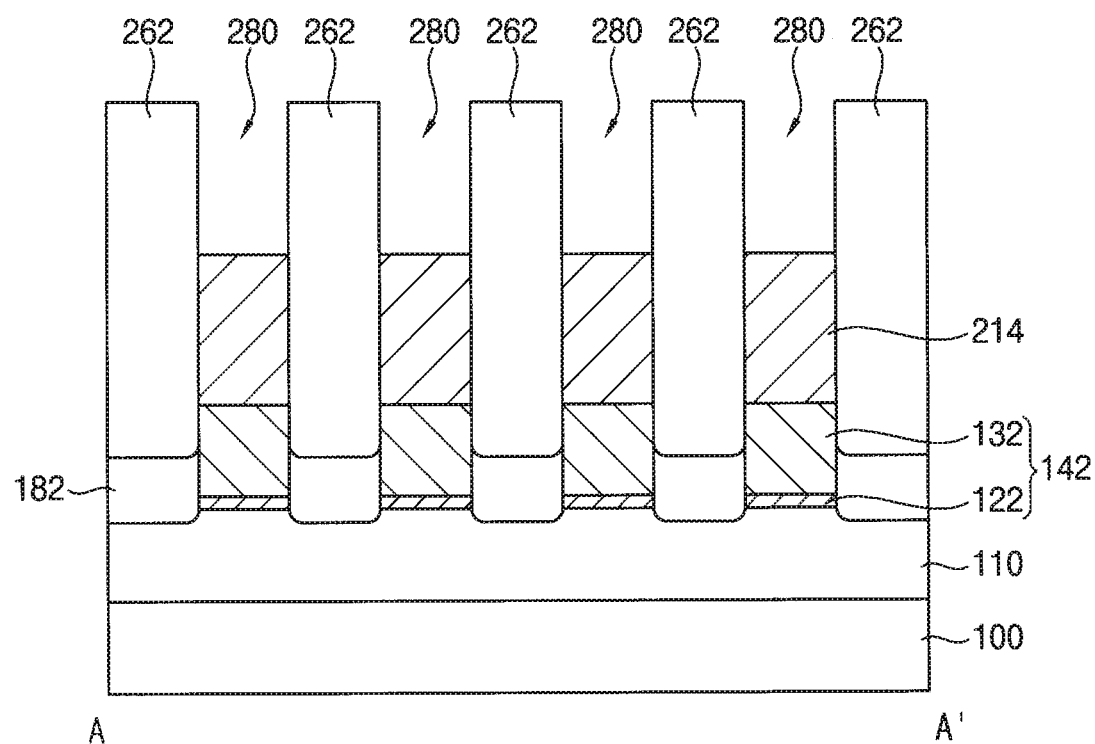
FIG. 17 is a cross-sectional view illustrating a method of manufacturing a variable resistance memory device in accordance with an embodiment.
Figure 17:
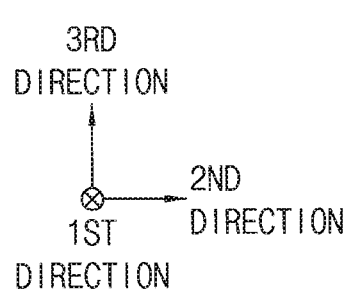
Figure 18:
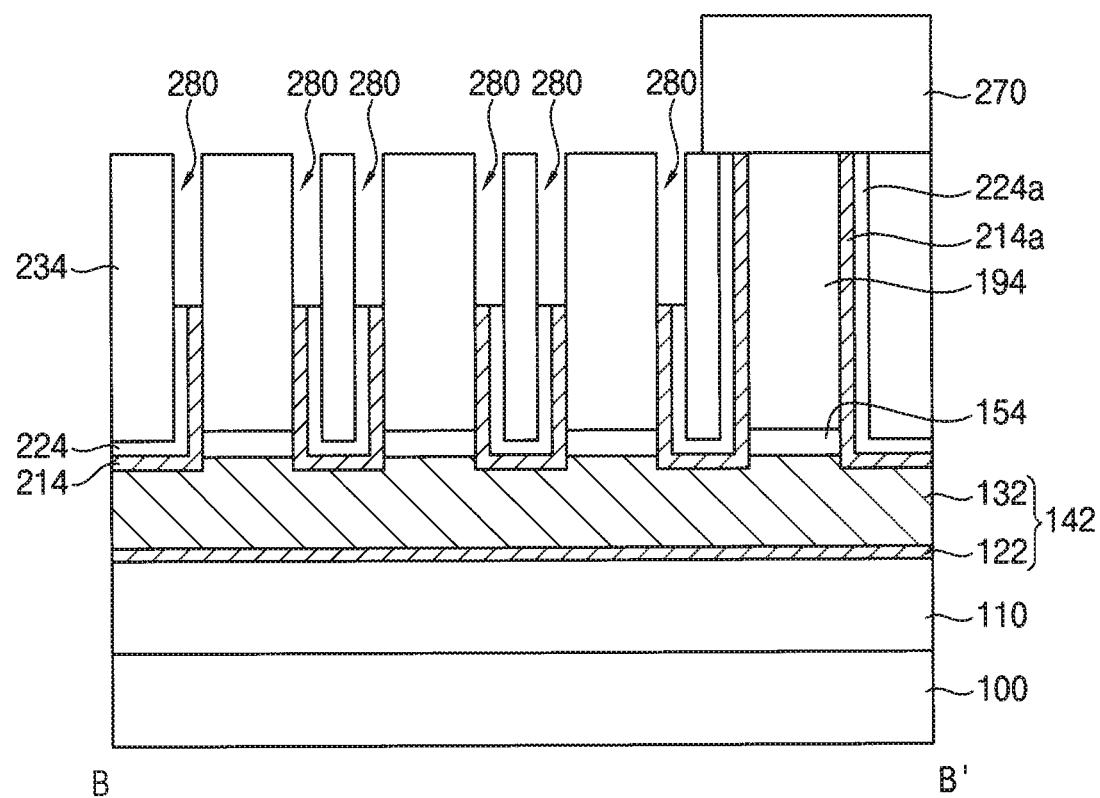
FIG. 18 is a cross-sectional view illustrating a method of manufacturing a variable resistance memory device in accordance with an embodiment.

Referring to FIGS. 16 to 18, a third etching mask 270 may be formed to partially cover the fifth insulating interlayer lines 262, the third and fourth insulating interlayer patterns 194 and 234, the first spacer 224 and the first electrode 214, and upper portions of the first electrode 214 and the first spacer 224 may be removed to form a first recess 280.

In example embodiments, the third etching mask 270 may extend in the second direction, and one or a plurality of third etching masks 270 may be formed to be spaced apart from each other in the first direction. In the figure, only one third etching mask 270 is shown.

By the etching process, upper surfaces of portions of the first electrode 214 and the first spacer 224 having the first recess 280 thereon may be lower than those of portions of the first electrode 214 and the first spacer 224 covered by the third etching mask 270. Hereinafter, the portions of the first electrode 214 and the first spacer 224 covered by the third etching mask 270 may be referred to as a fourth electrode 214a and a second spacer 224a, respectively.

Figure 19:
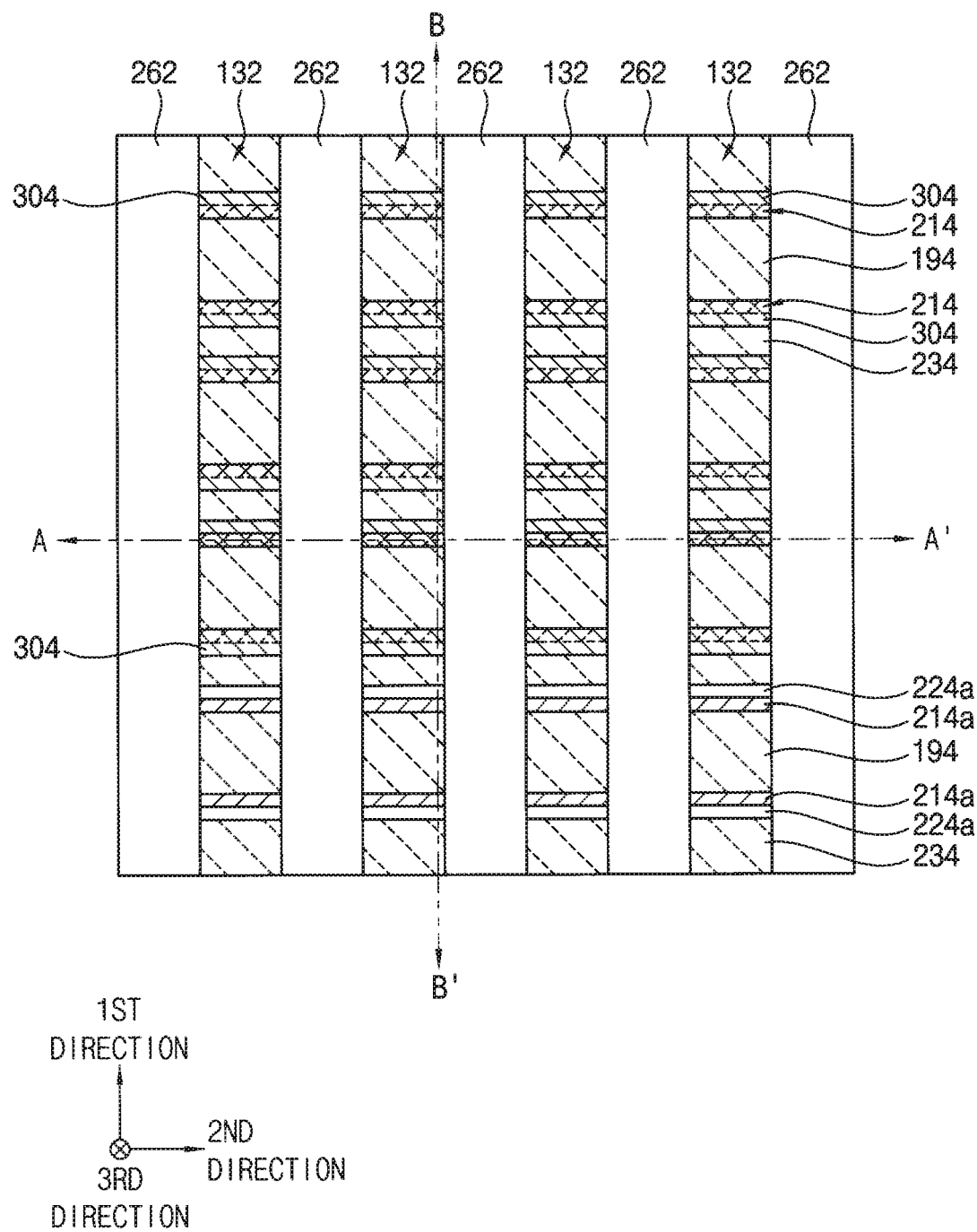
FIG. 19 is a plan view illustrating a method of manufacturing a variable resistance memory device in accordance with an embodiment.
Figure 20:
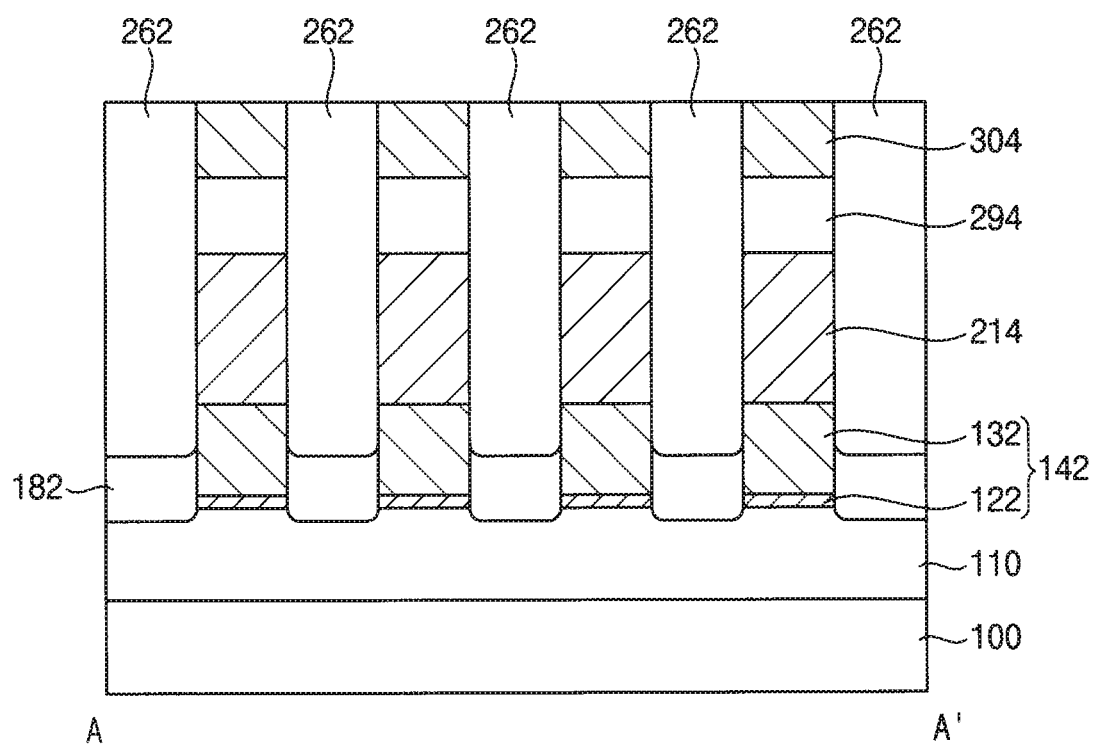
FIG. 20 is a cross-sectional view illustrating a method of manufacturing a variable resistance memory device in accordance with an embodiment.
Figure 20:
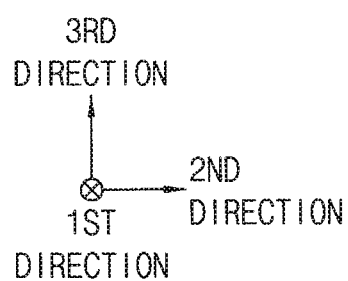
Figure 21:
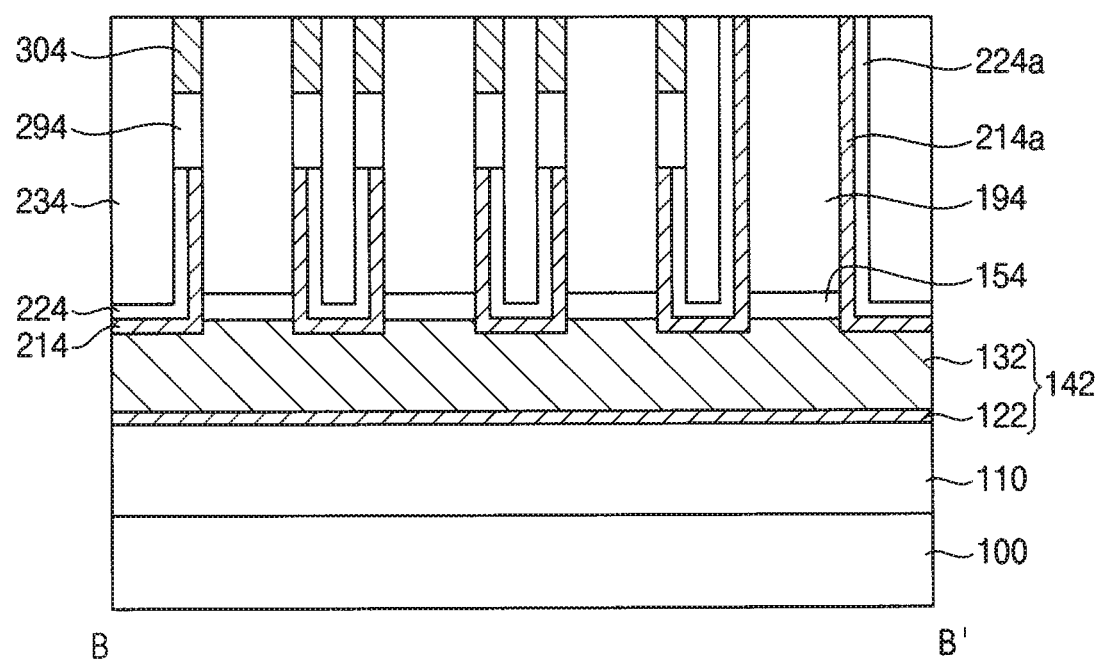
FIG. 21 is a cross-sectional view illustrating a method of manufacturing a variable resistance memory device in accordance with an embodiment.
Figure 21:
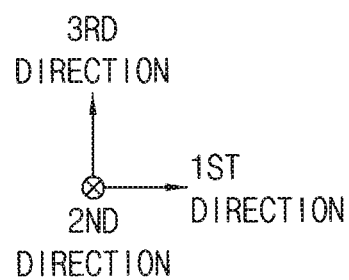

Referring to FIGS. 19 to 21, after removing the third etching mask 270, a variable resistance pattern 294 and a second electrode 304 may be formed in lower and upper portions, respectively, of the first recess 280.

The variable resistance pattern 294 may be formed by forming a variable resistance layer on the first and fourth electrodes 214 and 214a, the first and second spacers 224 and 224a, the third and fourth insulating interlayer patterns 194 and 234, and the fifth insulating interlayer lines 262 to sufficiently fill the first recess 280, and planarizing the variable resistance layer until upper surfaces of the third and fourth insulating interlayer patterns 194 and 234 may be exposed.

In example embodiments, the first variable resistance layer may include a phase change material of which a resistance may change according to the phase thereof. In one embodiment, the variable resistance layer may include a chalcogenide-based material in which germanium (Ge), antimony (Sb) and/or tellurium (Te) may be combined in a given ratio. In one embodiment, the variable resistance layer may include a super lattice in which germanium-tellurium (GeTe) and antimony-tellurium (SbTe) may be repeatedly stacked. In one embodiment, the variable resistance layer may include IST containing indium-antimony-tellurium, or BST containing bismuth-antimony-tellurium. The variable resistance layer may further include carbon (C), nitride (N), boron (B), oxygen (O), etc.

In example embodiments, the variable resistance layer may include a perovskite-based material or a transition metal oxide. The perovskite-based material may include, e.g., STO ($SrTiO_3$), BTO ($BaTiO_3$), PCMO ($Pr_{1-x}Ca_xMnO_3$), etc. The transition metal oxide may include, e.g., titanium oxide ($TiO_x$), zirconium oxide ($ZrO_x$), aluminum oxide ($AlO_x$), hafnium oxide ($HfO_x$), etc. These may be used alone or in a combination thereof.

The second electrode 304 may be formed by removing an upper portion of the variable resistance pattern 294 to form a second recess, forming a second electrode layer on the variable resistance pattern 294, the first and fourth electrodes 214 and 214a, the first and second spacers 224 and 224a, the third and fourth insulating interlayer patterns 194 and 234, and the fifth insulating interlayer lines 262 to sufficiently fill the second recess, and planarizing the second electrode layer until the upper surfaces of the third and fourth insulating interlayer patterns 194 and 234 may be exposed.

The second electrode layer may include a metal nitride, e.g., titanium nitride, tungsten nitride, tantalum nitride, etc.

The variable resistance pattern 294 and the second electrode 304 may be sequentially stacked on the first electrode 214 in the third direction, and a plurality of variable resistance patterns 294 and a plurality of second electrodes 304 may be formed in each of the first and second directions. The first electrode 214, the variable resistance pattern 294 and the second electrode 304 sequentially stacked may form a memory unit.

Figure 22:
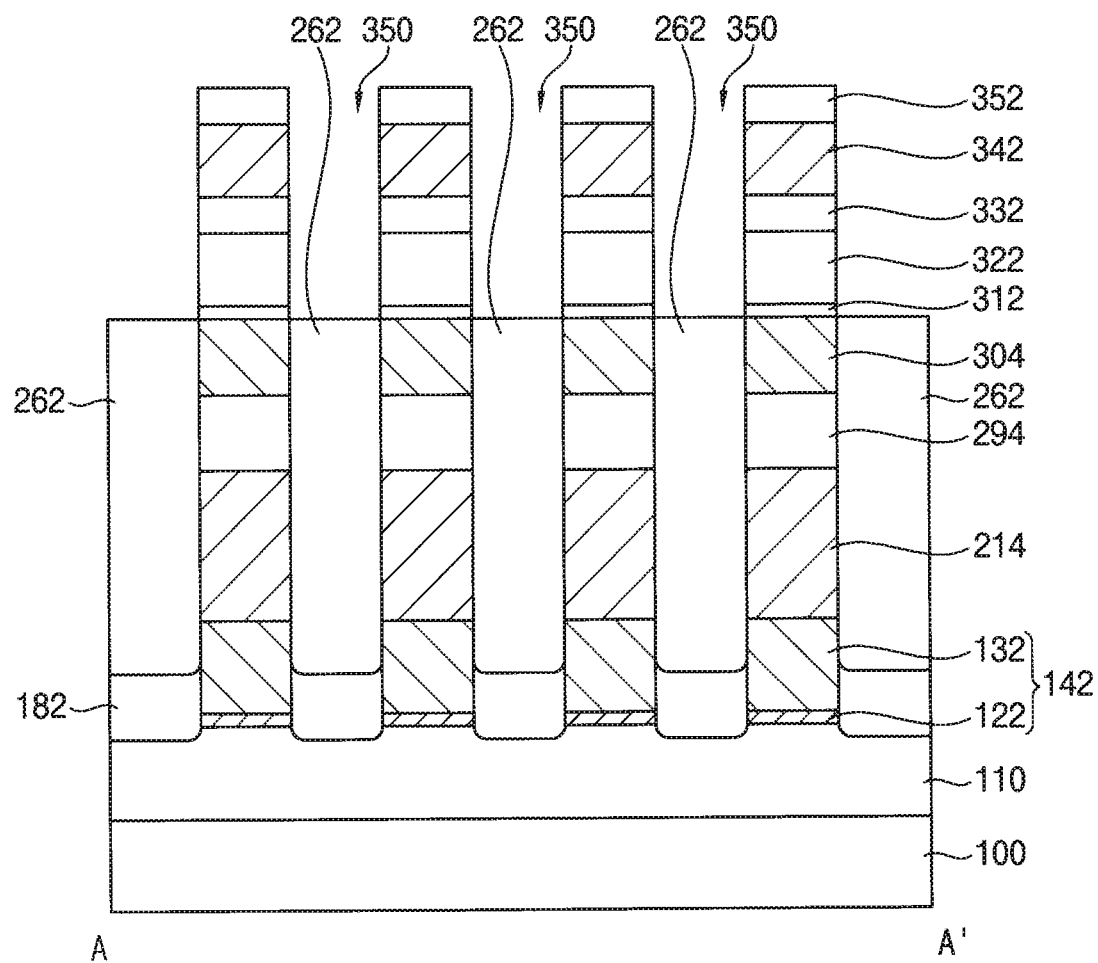
FIG. 22 is a cross-sectional view illustrating a method of manufacturing a variable resistance memory device in accordance with an embodiment.
Figure 23:
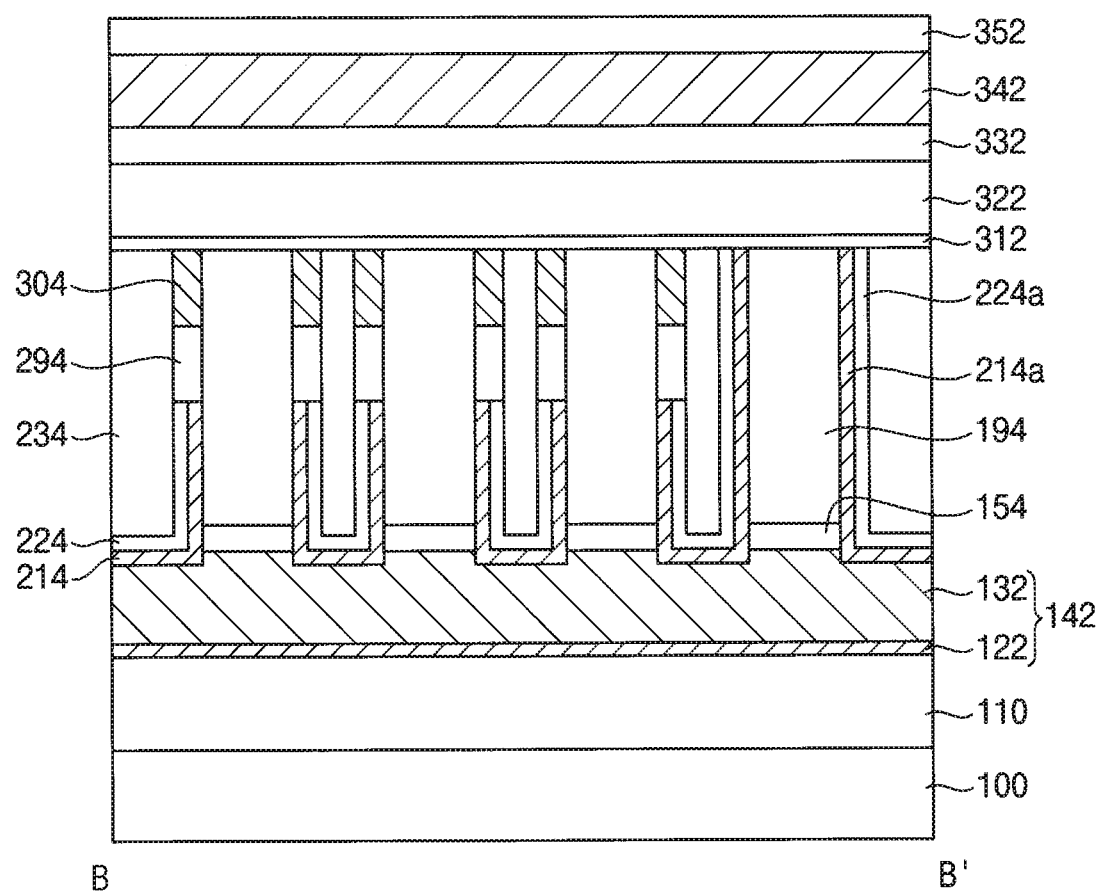
FIG. 23 is a cross-sectional view illustrating a method of manufacturing a variable resistance memory device in accordance with an embodiment.
Figure 23:
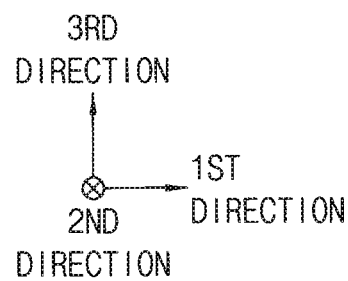

Referring to FIGS. 22 and 23, a fourth structure including a selection line structure and a third electrode line structure sequentially stacked may be formed on the memory unit.

The fourth structure may be formed by sequentially stacking a selection layer structure and a third electrode layer structure on the fifth insulating interlayer lines 262, the third and fourth insulating interlayer patterns 194 and 234, the first and second spacers 224 and 224a, the first and fourth electrodes 214 and 214a, and the second electrodes 304, forming a fourth etching mask on the third electrode layer structure to extend in the first direction and overlap the second electrode 304 in the third direction, and etching the third electrode layer structure and the selection layer structure using the fourth etching mask.

In example embodiments, the fourth structure may extend in the first direction, and a plurality of fourth structures may be formed to be spaced apart from each other in the second direction. A fourth opening 350 may be formed between neighboring fourth structures in the second direction to expose an upper surface of the fifth insulating interlayer line 262.

The selection line structure may include a first buffer line 312, a selection line 322 and a second buffer line 332.

Each of the first and second buffer lines 312 and 332 may include carbon or a metal containing carbon. For example, each of the first and second buffer lines 312 and 332 may include carbon, carbonitride, titanium carbonitride and/or tantalum carbonitride.

In example embodiments, the selection line 322 may include an ovonic threshold switches (OTS) material, which may serve as a switching function due to a difference of resistance thereof depending on an applied voltage while maintaining an amorphous state.

The OTS material may include, e.g., germanium (Ge), silicon (Si), arsenic (As) and/or tellurium (Te), and may further include selenium (Se), sulfur (S), carbon (C), nitrogen (N), indium (In), boron (B), etc.

The OTS material may include, e.g., AsTeGeSiIn, GeTe, SnTe, GeSe, SnSe, AsTeGeSiSbS, AsTeGeSiInP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe, $Ge_xSe_{1-x}$, etc.

The third electrode line structure may include a third electrode line 342 and a third buffer line 352 that are sequentially stacked.

The third electrode line 342 may include a metal nitride, e.g., titanium nitride, tungsten nitride, tantalum nitride, etc. The third buffer line 352 may include carbon or a metal containing carbon.

Although the third electrode line structure includes the third electrode line 342 and the third buffer line 352 sequentially stacked, only one of the third electrode line 342 and the third buffer line 352 may be included.

Figure 24:
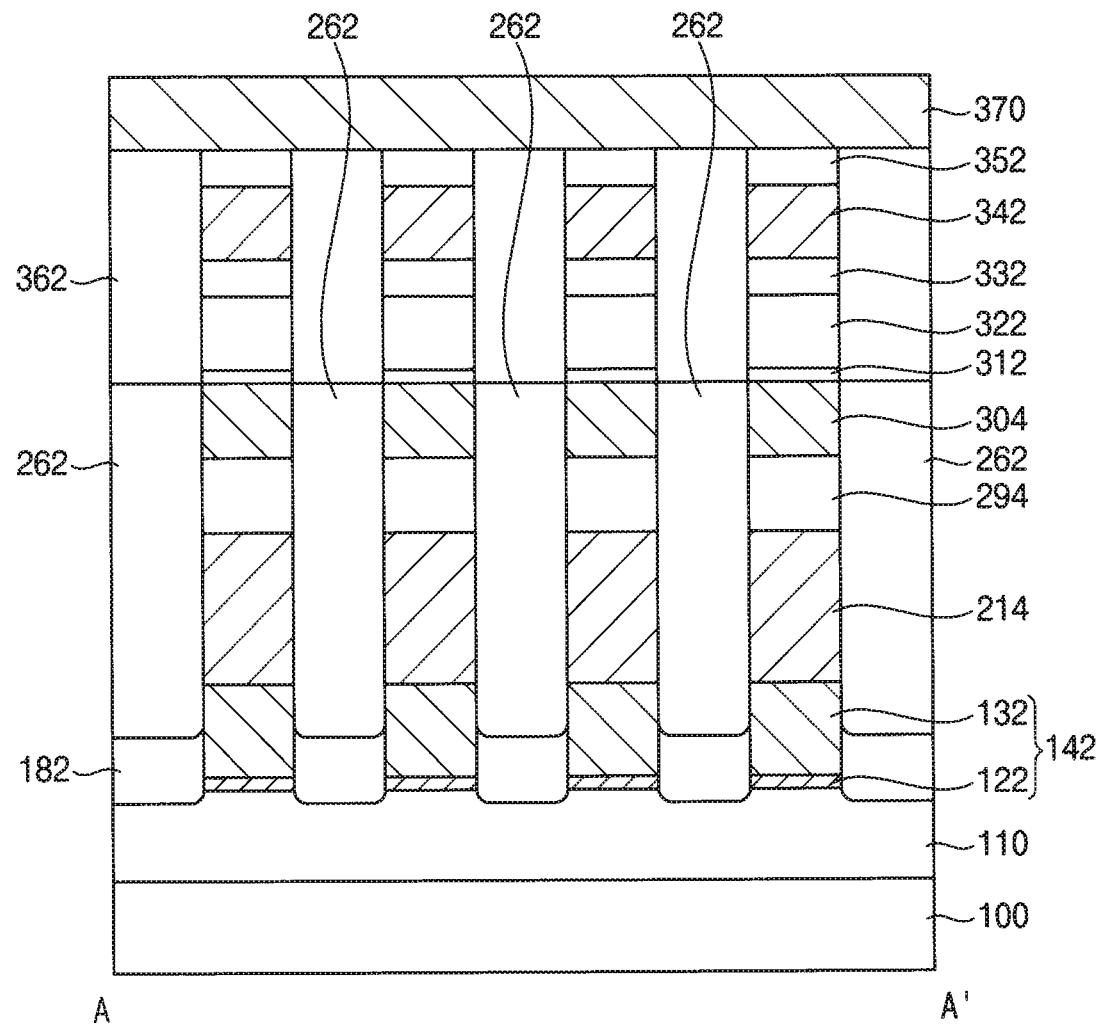
FIG. 24 is a cross-sectional view illustrating a method of manufacturing a variable resistance memory device in accordance with an embodiment.
Figure 24:
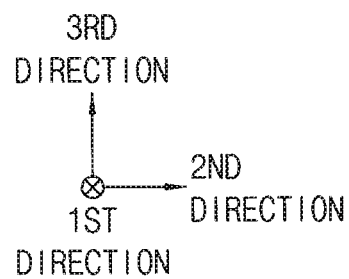

Referring to FIG. 24, a sixth insulating interlayer line 362 may be formed to fill the fourth opening 350.

The sixth insulating interlayer line 362 may be formed by forming a sixth insulating interlayer on the fifth insulating interlayer lines 262 to fill the fourth opening 350 and cover the fourth structures, and planarizing the sixth insulating interlayer until upper surfaces of the fourth structures may be exposed. During the planarization process, the fourth etching mask may be removed.

Thus, the sixth insulating interlayer line 362 may extend in the first direction to cover a sidewall of the fourth structure, and a plurality of sixth insulating interlayer lines 362 may be formed to be spaced apart by respective fourth structures from each other in the second direction. The sixth insulating interlayer line 362 may include an oxide, e.g., silicon oxide.

A second conductive layer 370 may be formed on the sixth insulating interlayer lines 362 and the fourth structures. The second conductive layer 370 may include a single-layered structure or a multi-layered structure. The second conductive layer 370 may be the multi-layered structure, and the multi-layered structure of the second conductive layer 370 may include a second barrier layer a metal layer sequentially stacked. The second barrier layer may include a metal nitride or a metal silicon nitride, and the second metal layer may include a metal, e.g., tungsten, platinum, copper, aluminum, titanium, tantalum, etc.

Figure 25:
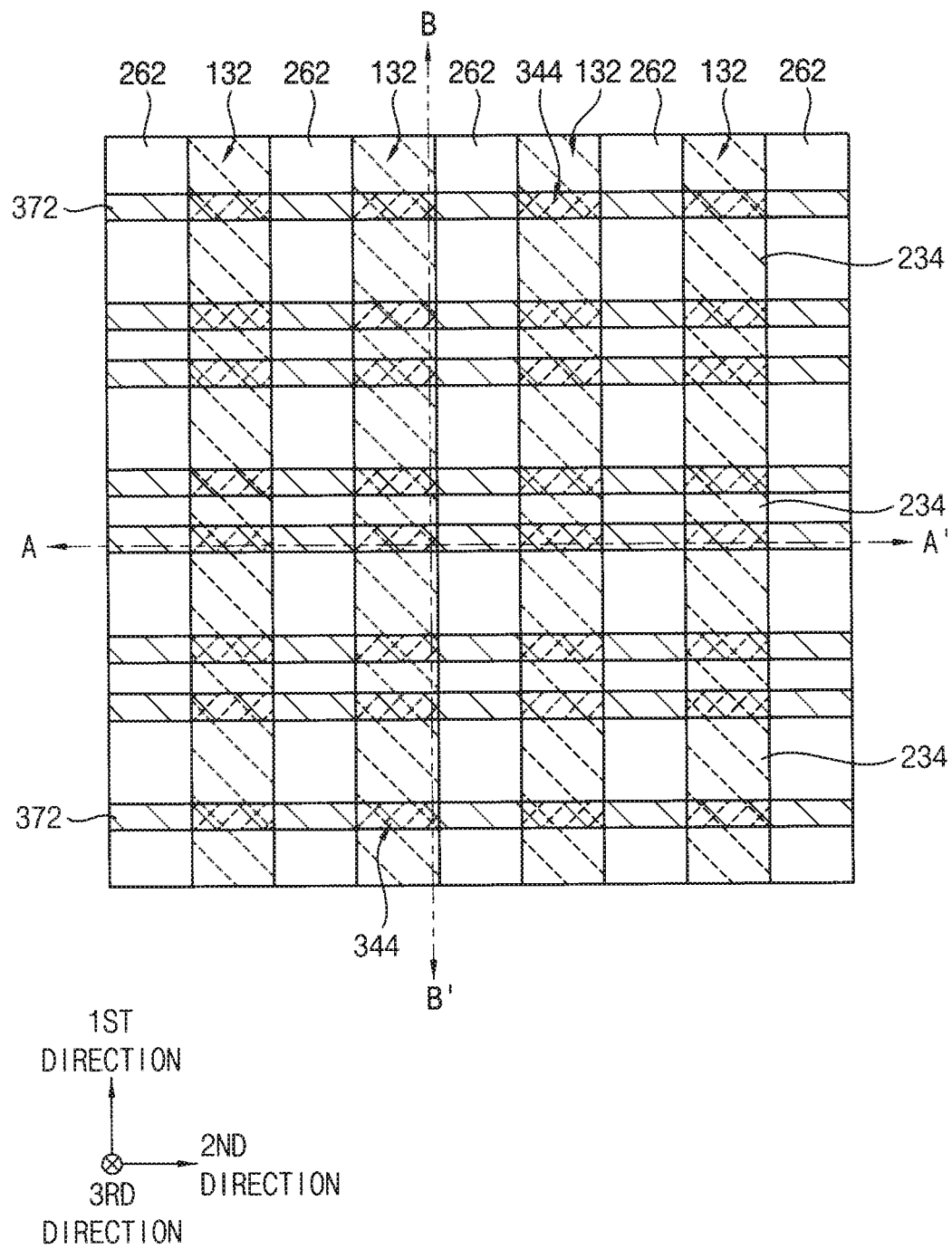
FIG. 25 is a plan view illustrating a method of manufacturing a variable resistance memory device in accordance with an embodiment.
Figure 26:
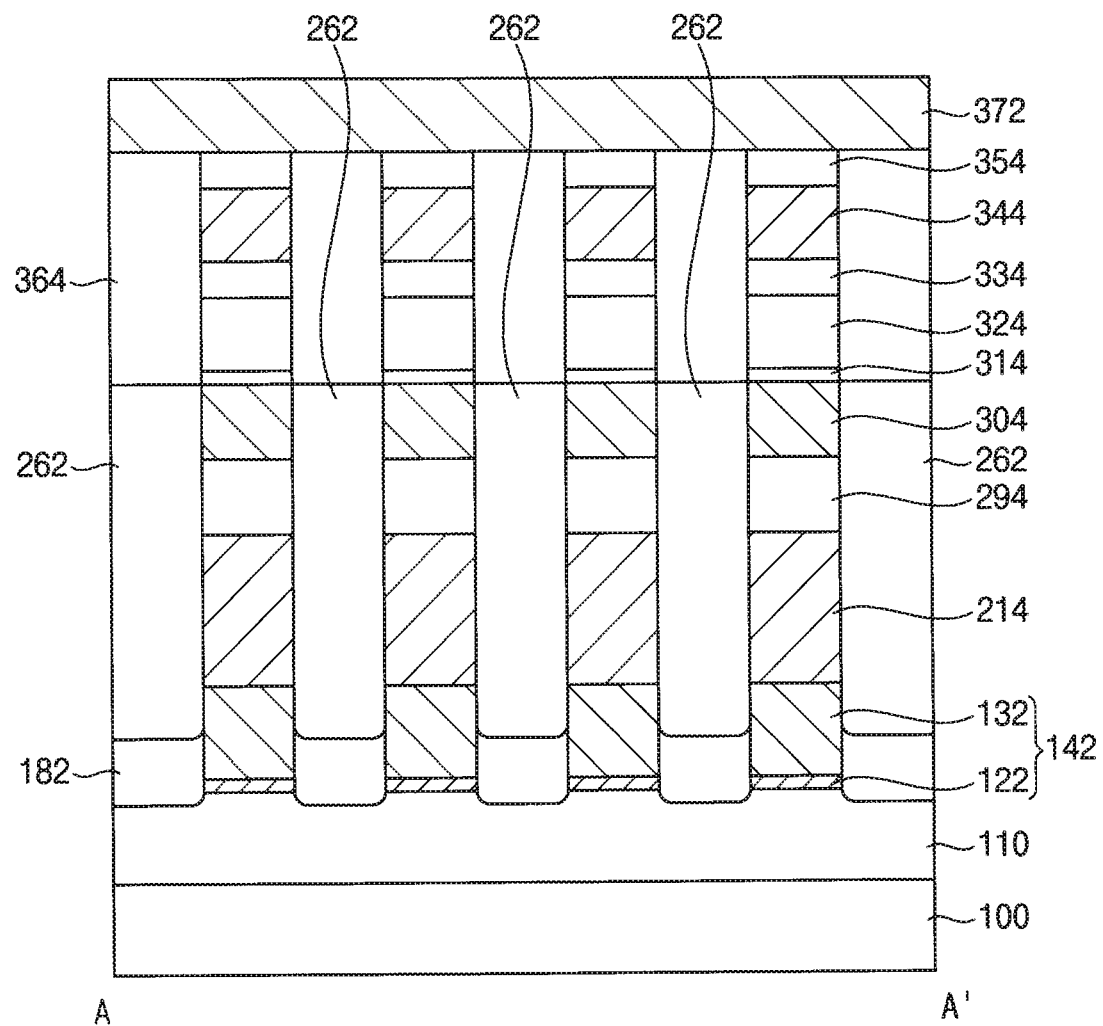
FIG. 26 is a cross-sectional view illustrating a method of manufacturing a variable resistance memory device in accordance with an embodiment.
Figure 26:
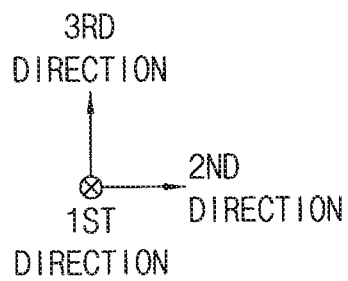
Figure 27:
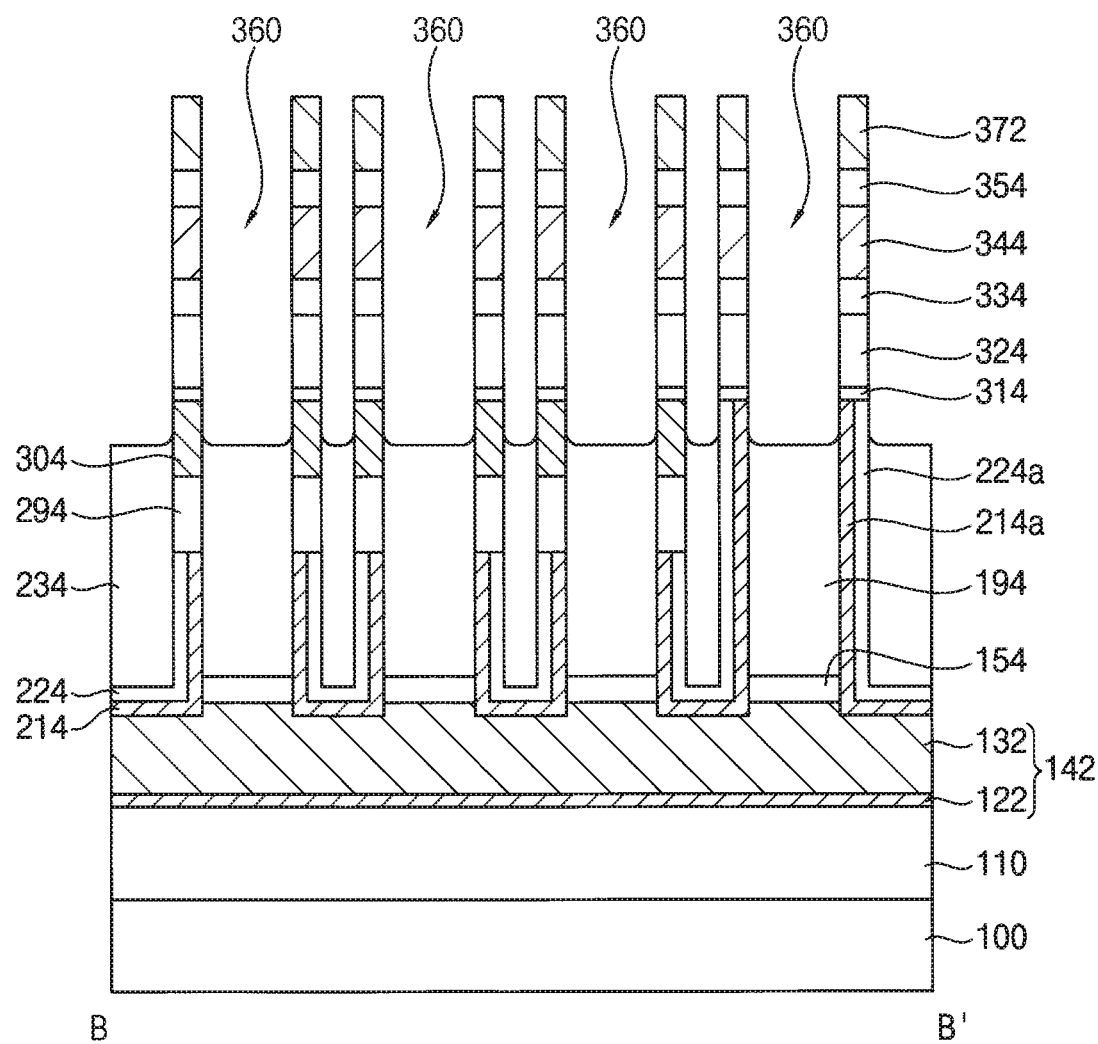
FIG. 27 is a cross-sectional view illustrating a method of manufacturing a variable resistance memory device in accordance with an embodiment.

Referring to FIGS. 25 to 27, a fifth etching mask may be formed on the second conductive layer 370 to extend in the second direction and overlap the second electrodes 304 in the third direction, and the second conductive layer 370, the fourth structures and the sixth insulating interlayer lines 362 may be etched using the fifth etching mask to form a fifth structure.

In example embodiments, the fifth structure may extend in the second direction, and a plurality of fifth structures may be formed to be spaced apart from each other in the first direction. A fifth opening 360 may be formed between neighboring fifth structures in the first direction to expose upper surfaces of the third and fourth insulating interlayer patterns 194 and 234 and an upper surface of the fifth insulating interlayer line 262.

The fifth structure may include a first selection structure and a third structure sequentially stacked, and the second conductive line 372. The first selection structure may include a first buffer 314, a first selection pattern 324 and a second buffer 334 sequentially stacked, and the third electrode structure may include a third electrode 344 and a third buffer 354 sequentially stacked.

In example embodiments, the second conductive line 372 may serve as a bit line of the variable resistance memory device. Alternatively, the second conductive line 372 may serve as a word line. The second conductive line 372 may have a multi-layered structure, and the multi-layered structure of the second conductive line 372 may include a second barrier line and a second metal line sequentially stacked.

During the etching process, upper portions of the third and fourth insulating interlayer patterns 194 and 234 may be partially removed.

Referring to FIGS. 28 to 30A, a capping layer may be formed on the third and fourth insulating interlayer patterns 194 and 234 and the fifth insulating interlayer line 262 to cover the fifth structure, a seventh insulating interlayer may be formed on the capping layer to fill the fifth opening 360, and planarizing the seventh insulating interlayer and the capping layer until an upper surface of the fifth structure may be exposed.

By the planarization process, the seventh insulating interlayer and the capping layer may be transformed into a seventh insulating interlayer line 392 and a capping line 382 each of which may extend in the second direction. During the planarization process, the fifth etching mask on the fifth structure may be removed.

The capping line 382 may include, e.g., amorphous silicon or a nitride, e.g., silicon nitride, silicon oxynitride, silicon carbonitride, silicon boronitride, etc. The first selection pattern 324 of the fifth structure may be prevented from being oxidized due to the capping line 382, and moisture or chemical residue may be prevented from penetrating into the first selection pattern 324.

The seventh insulating interlayer line 392 may include an oxide, e.g., silicon oxide.

The variable resistance memory device may be fabricated by the above processes.

As illustrated above, when the upper portions of the first electrodes 214 are removed to form the first recess 280, the third etching mask 270 covering one of the first electrodes 214 may be formed so that the fourth electrode 214a may remain. Thus, unlike a memory unit including the first electrode 214, the variable resistance pattern 294 and the second electrode 304 sequentially stacked, which may be formed by forming the variable resistance pattern 294 and the second electrode 304 filling the first recess 280, the first selection structure and the third electrode structure may be directly stacked on the fourth electrode 214a, which may serve as an anti-fuse instead of a memory unit.

That is, in a cell region in which memory units may be formed, the variable resistance pattern 294 and the second electrode 304 may not be formed so that an anti-fuse including the fourth electrode 214a, the first selection structure and the third electrode structure sequentially stacked may be easily formed. The anti-fuse may not be formed in a peripheral circuit region but in the cell region, the area of the peripheral circuit region may not increase, and an anti-fuse of high capacity may be easily formed.

Hereinafter, to differentiate from those on the memory unit, the first selection structure and the third electrode structure on the fourth electrode 214a may be referred to as a second selection structure and a fifth electrode structure, respectively. That is, the fourth electrode 214a, the second selection structure and the fifth electrode structure may form an anti-fuse.

The fourth electrode 214a may be formed by the same process as that of the first electrode 214, and thus may include the same material. The second structure and the fifth electrode structure may be also formed by the same processes as those of the first selection structure and the third electrode, respectively, and thus may include the same material, respectively. Each of the first and second selection structures may include the first buffer 314, the first selection pattern 324 and the second buffer 334 sequentially stacked, and each of the third and fifth structures may include the third electrode 344 and the third buffer 354 sequentially stacked.

The variable resistance memory device may include the following structural characteristics.

The variable resistance memory device may include a plurality of first conductive lines 142 disposed in the second direction each of which may extend in the first direction, a plurality of second conductive lines 372 disposed in the first direction each of which may extend in the second direction, a plurality of memory units at first regions, respectively, among regions between the first and second conductive lines 142 and 372 at which the first and second conductive lines 142 and 372 overlap with each other in the third direction, each of which may include the first electrode 214, the variable resistance pattern 294 and the second electrode 304 sequentially stacked, the first selection structure on each of the memory units, and the anti-fuse at a second region among the regions that may include the fourth electrode 214a, the second selection structure and the fifth electrode structure.

In example embodiments, a bottom of the fourth electrode 214a may be substantially coplanar with a bottom of the first electrode 214, and an uppermost surface of the fourth electrode 214a may be substantially coplanar with an upper surface of the second electrode 304 and higher than an uppermost surface of the first electrode 214. Thus, a length of the fourth electrode 214a in the third direction may be greater than a length of the first electrode 214 in the third direction, and may be substantially equal to a length of the memory unit in the third direction.

In example embodiments, a cross-section taken along the first direction of the first electrode 214 may have a U-like shape. The variable resistance pattern 294 and the second electrode 304 may be sequentially stacked on an uppermost surface of each of the first electrodes 214.

In example embodiments, the uppermost surface of each of the first electrode 214 may directly contact a bottom of the variable resistance pattern 294, but may have an area smaller than an area of the bottom of the variable resistance pattern 294. The uppermost surface of each of the fourth electrodes 214a may directly contact a bottom of the second selection structure, but may have an area smaller than an area of the bottom of the second selection structure.

In an example embodiment, the fourth electrode 214a may directly contact the first electrode 214.

Figure 30A:
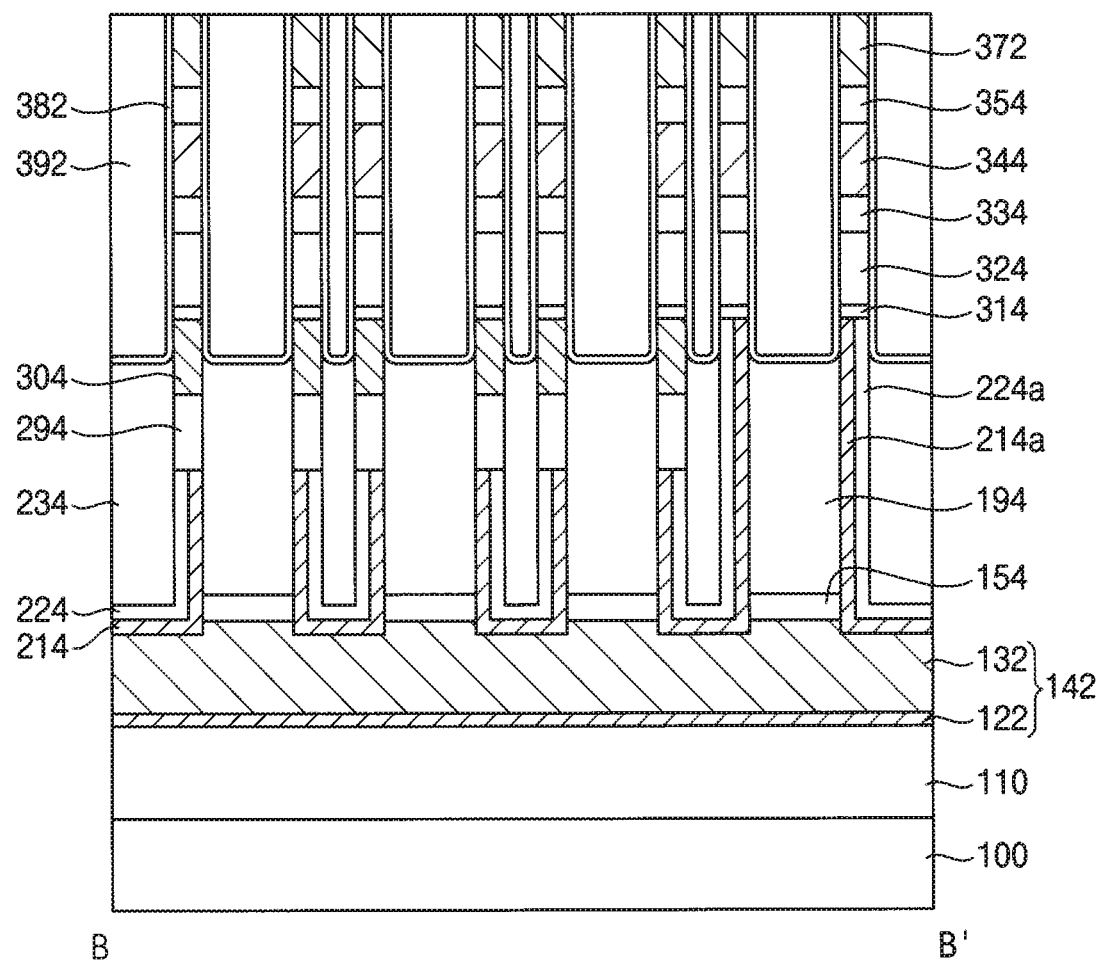
FIGS. 30A and 30B are a cross-sectional views illustrating a method of manufacturing a variable resistance memory device in accordance with an embodiment.
Figure 30A:
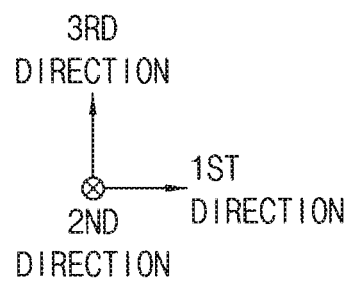
Figure 30B:
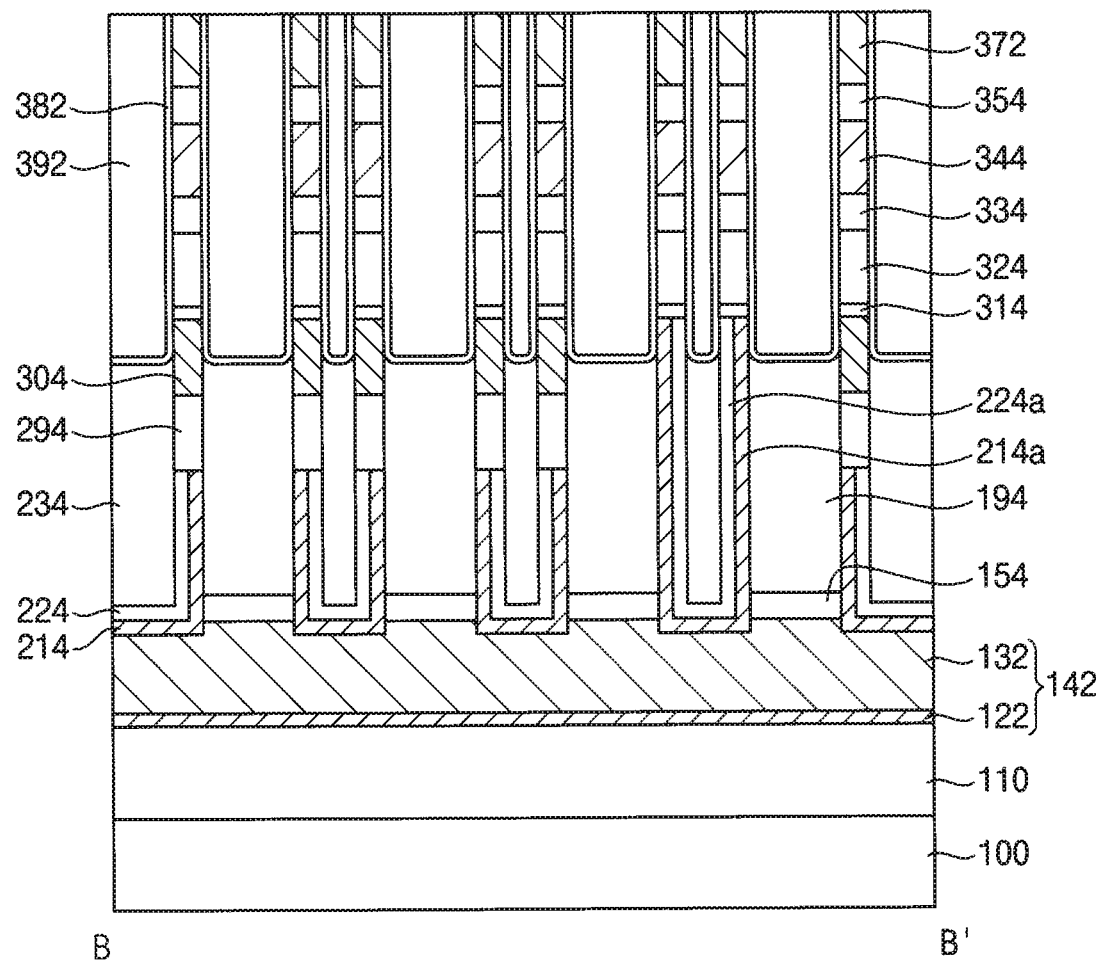
Figure 30B:
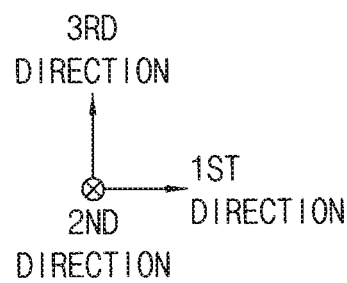

Referring to FIG. 30B, the fourth electrode 214a may not directly contact the first electrode 214, which may be implemented by adjusting the location of the third etching mask 270 in the processes illustrated with reference to FIGS. 16 to 18.

In example embodiments, the fourth electrode 214a may have a cross-section taken along the first direction having a U-like shape. The second selection structure and the fifth selection structure may be sequentially stacked on the uppermost surface of each of the fourth electrode 214a.

Figure 31:
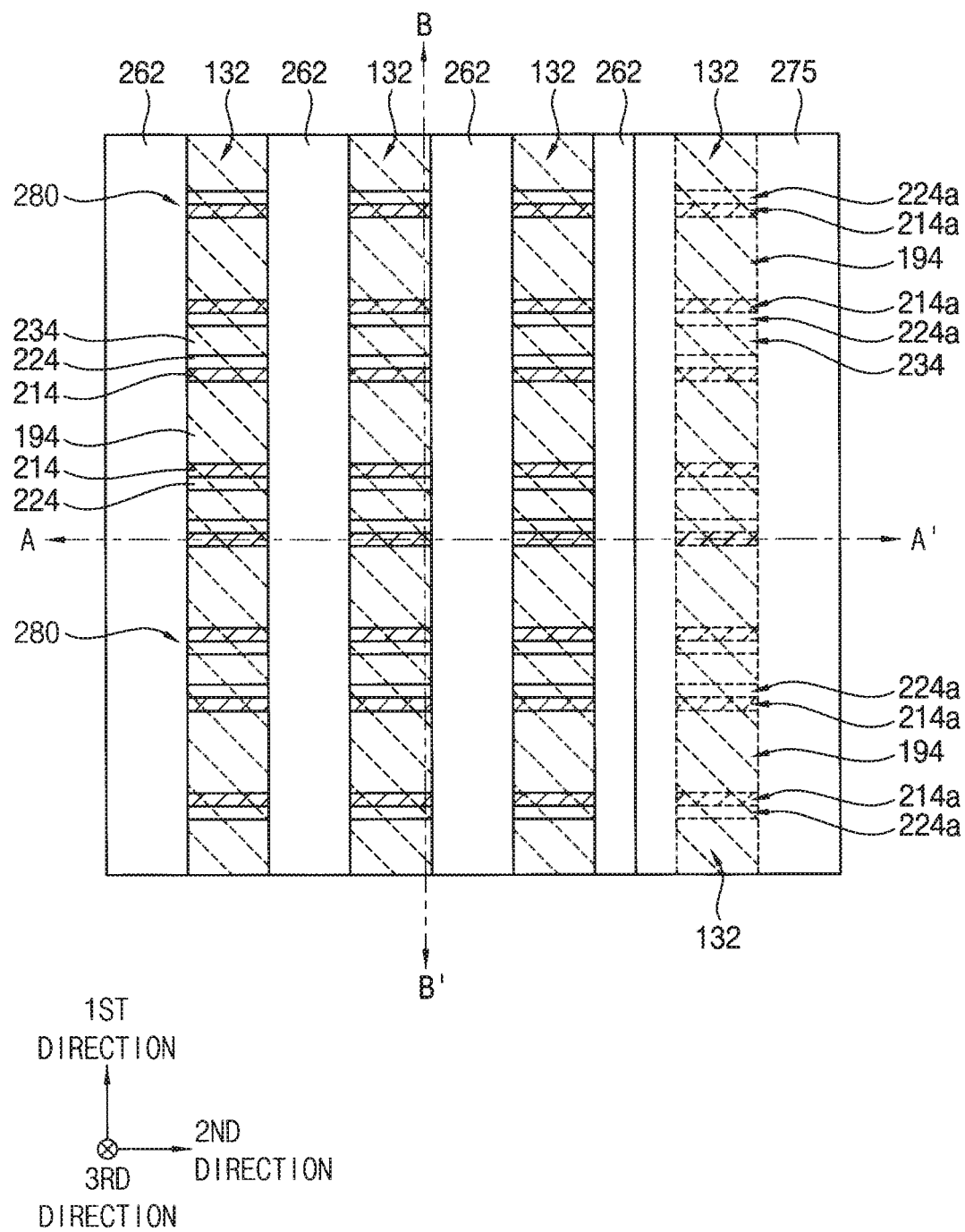
FIG. 31 is a plan view illustrating a method of manufacturing a variable resistance memory device in accordance with an embodiment.
Figure 32:
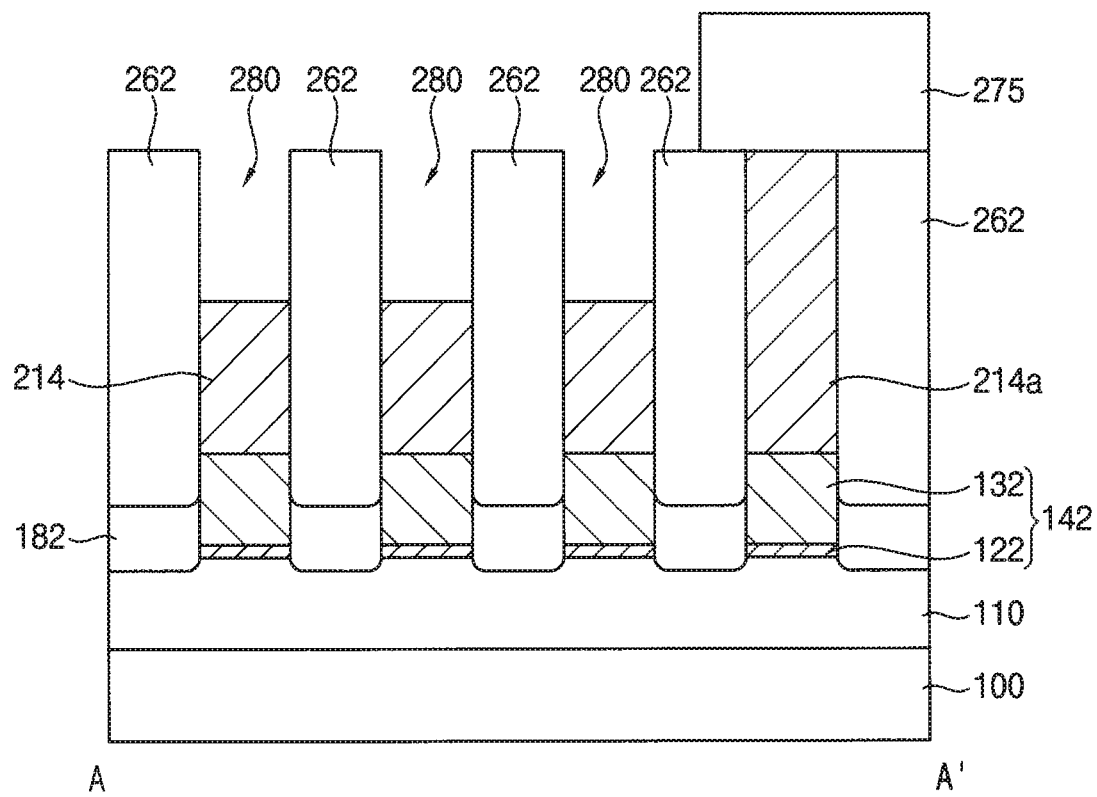
FIG. 32 is a cross-sectional view illustrating a method of manufacturing a variable resistance memory device in accordance with an embodiment.
Figure 32:
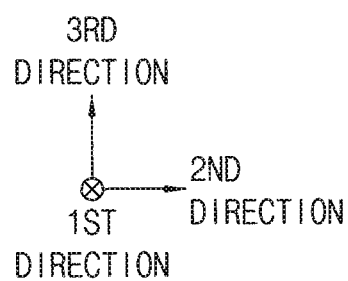
Figure 33:
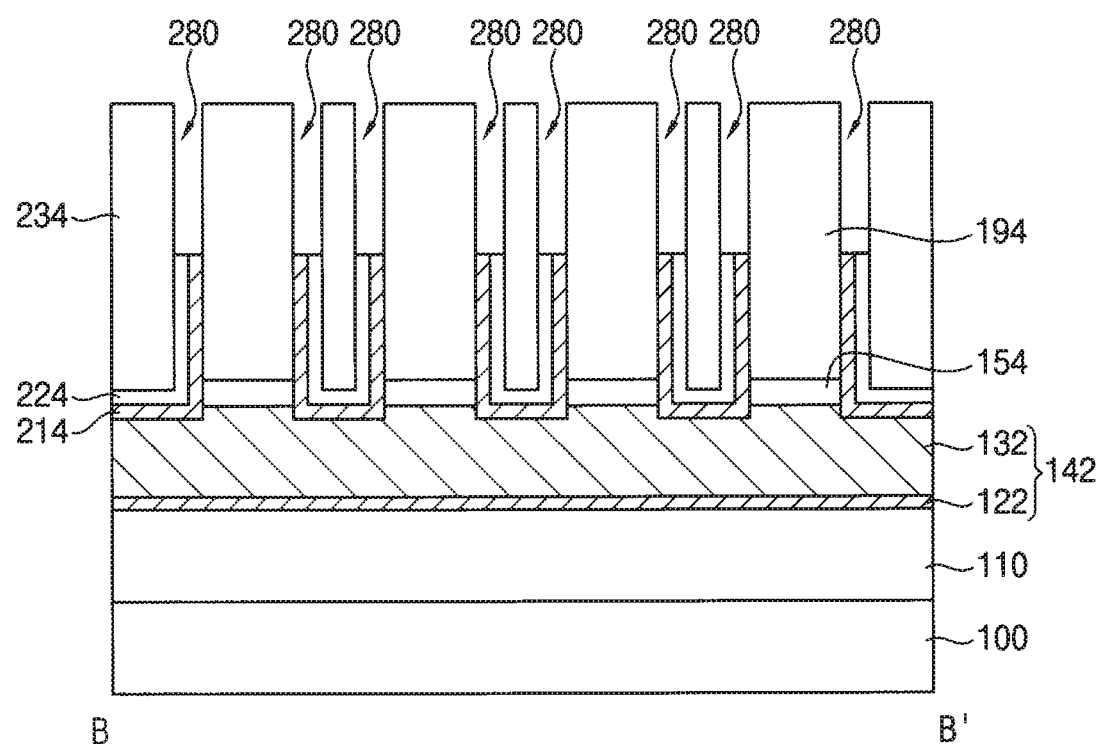
FIG. 33 is a cross-sectional view illustrating a method of manufacturing a variable resistance memory device in accordance with an embodiment.
Figure 34:
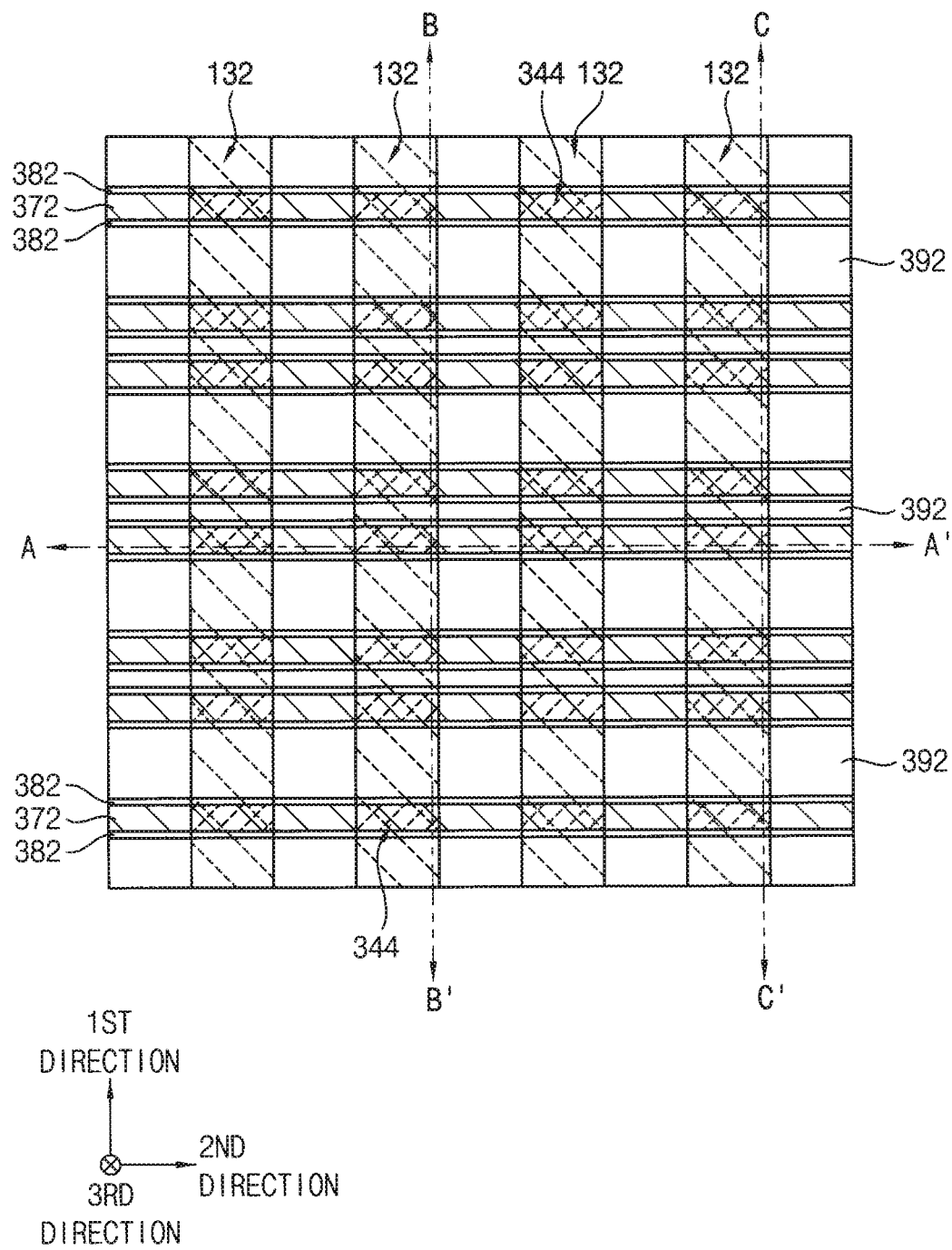
FIG. 34 is a plan view illustrating a method of manufacturing a variable resistance memory device in accordance with an embodiment.

FIGS. 31 to 37 are plan views and cross-sectional views illustrating steps of a method of manufacturing a variable resistance memory device in accordance with example embodiments. Specifically, FIGS. 31 and 34 are the plan views, and FIGS. 32-33 and 35-37 are the cross-sectional views.

Figure 35:
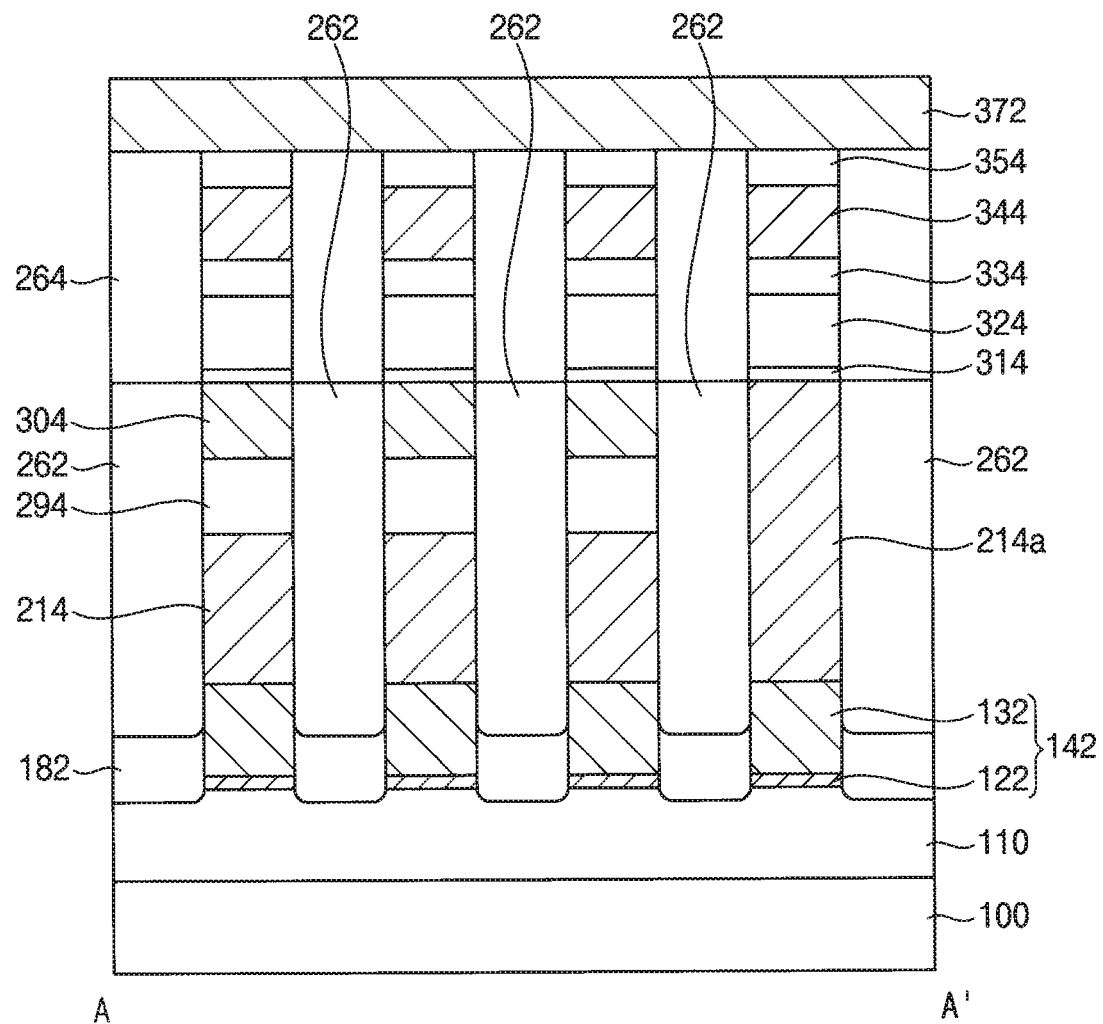
FIG. 35 is a cross-sectional view illustrating a method of manufacturing a variable resistance memory device in accordance with an embodiment.
Figure 35:
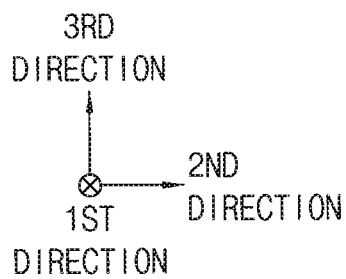
Figure 36:
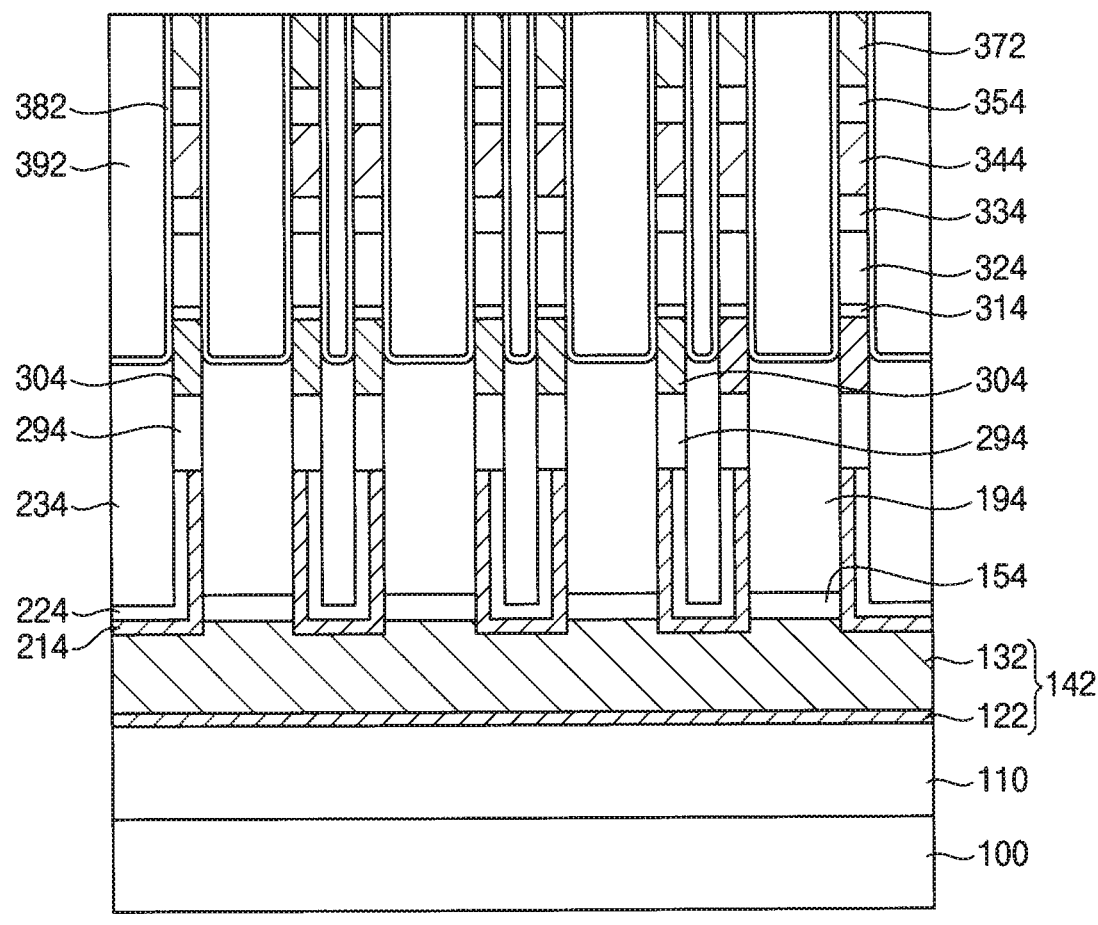
FIG. 36 is a cross-sectional view illustrating a method of manufacturing a variable resistance memory device in accordance with an embodiment.
Figure 36:
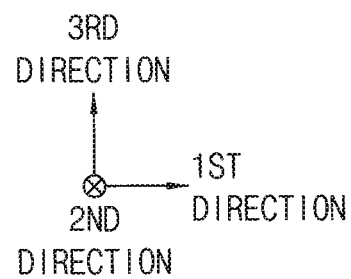
Figure 37:
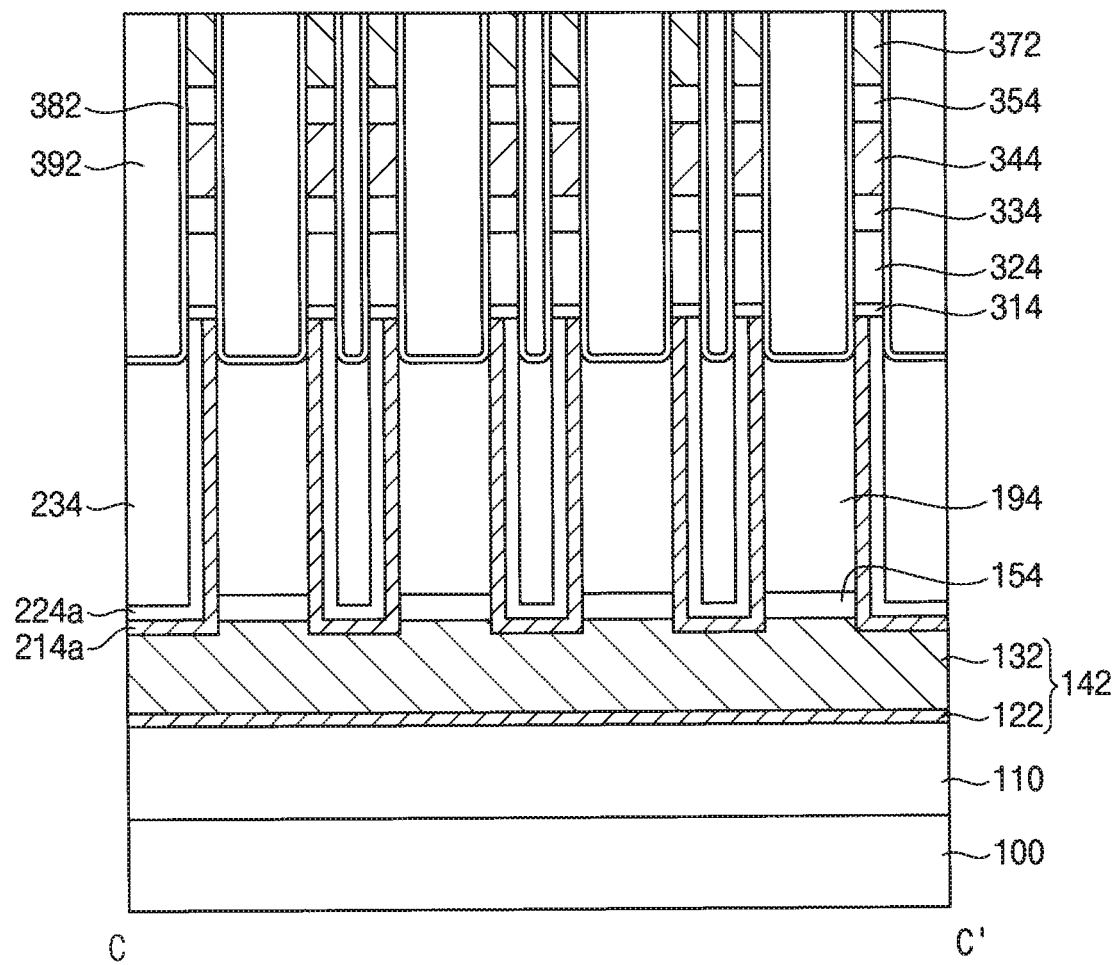
FIG. 37 is a cross-sectional view illustrating a method of manufacturing a variable resistance memory device in accordance with an embodiment.

In greater detail, FIGS. 32 and 35 are cross-sectional views taken along lines A-A' of corresponding plan views, respectively, FIGS. 33 and 36 are cross-sectional views taken along lines B-B' of corresponding plan views, respectively, and FIG. 37 is a cross-sectional view taken along a lines C-C' of a corresponding plan view.

This method may include processes substantially the same as or similar to those illustrated with reference to FIGS. 1 to 30, and thus redundant descriptions thereon are omitted herein.

Referring to FIGS. 31 to 33, processes substantially the same as or similar to those illustrated with reference to FIGS. 1 to 18 may be performed.

However, a sixth etching mask 275 extending in the first direction may be formed instead of the third etching mask 270 extending in the second direction, and upper portions of the first electrode 214 and the first spacer 224 may be removed using the third etching mask 270 to form a first recess 280.

That is, when the upper portions of the first electrodes 214 are removed using the third etching mask 270, which is illustrated with reference to FIGS. 16 to 18, upper portions of first ones among the first electrodes 214 disposed in the second direction to form one a plurality of rows are not removed so that such of those among the first electrodes 214 may remain as the fourth electrodes 214a, respectively. However, when the upper portions of the first electrodes 214 are removed using the sixth etching mask 275, which is illustrated with reference to FIGS. 31 to 33, upper portions of second ones among the first electrodes 214 disposed in the first direction to form one a plurality of columns are not removed so that such of those among the first electrodes 214 may remain as the fourth electrodes 214a, respectively.

Referring to FIGS. 34 to 37, processes substantially the same as or similar to those illustrated with reference to FIGS. 19 to 30 may be performed to complete the fabrication of the variable resistance memory device.

Figure 28:
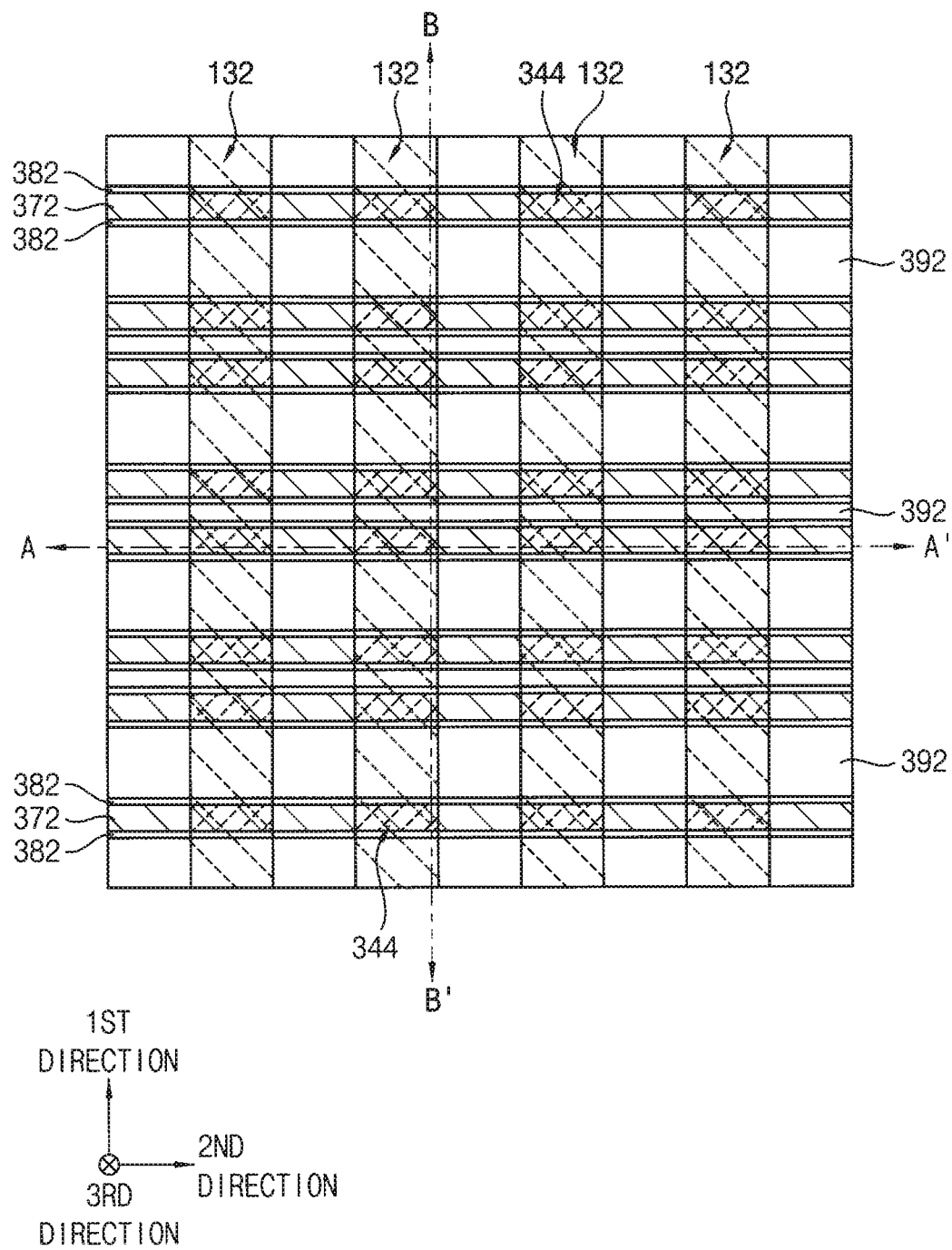
FIG. 28 is a plan view illustrating a method of manufacturing a variable resistance memory device in accordance with an embodiment.
Figure 29:
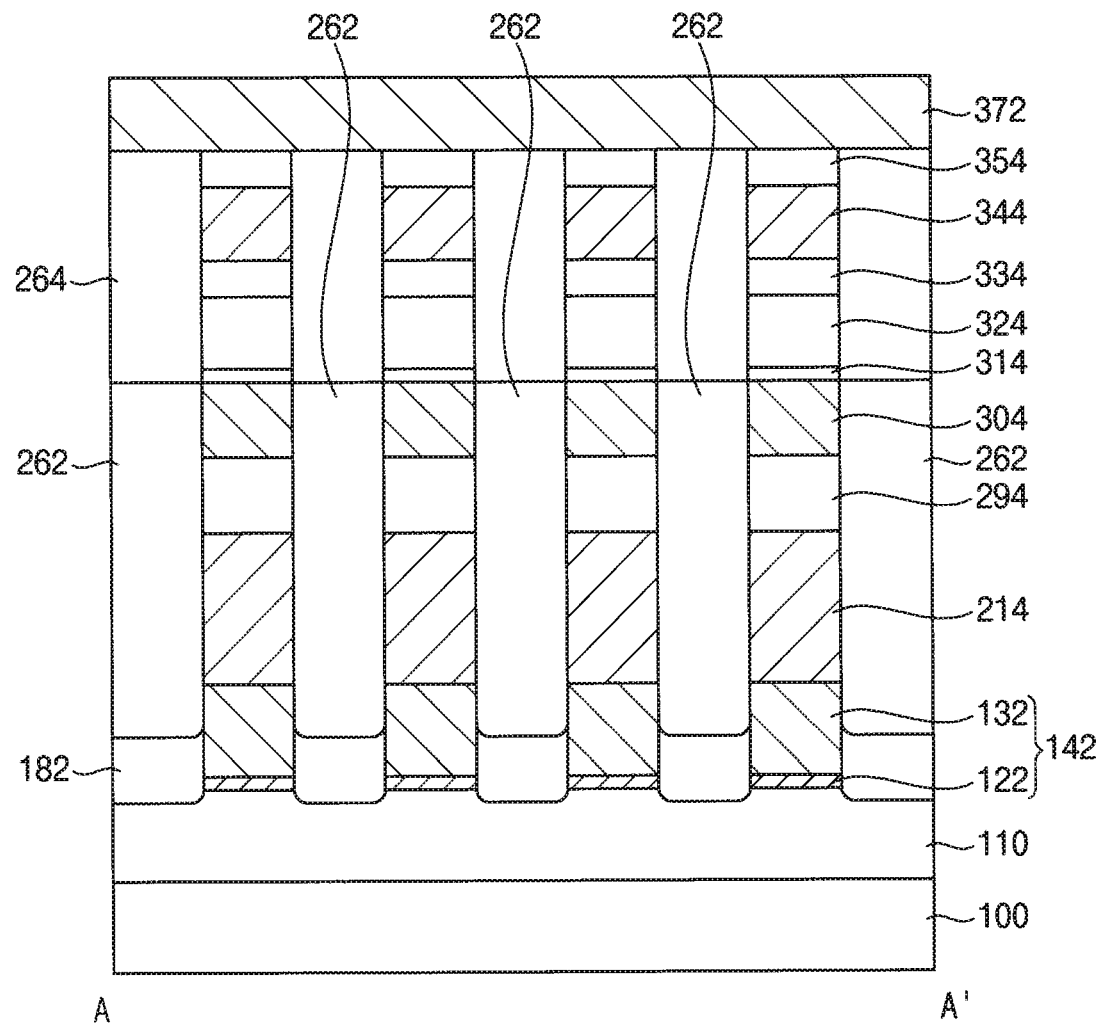
FIG. 29 is a cross-sectional view illustrating a method of manufacturing a variable resistance memory device in accordance with an embodiment.
Figure 29:
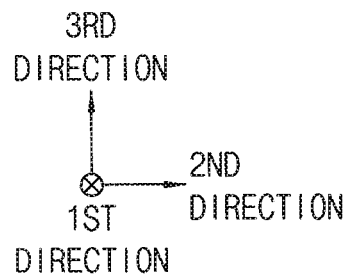

In FIGS. 28 to 30, the variable resistance memory device may include a plurality of anti-fuses disposed in the second direction, however, in FIGS. 34 to 37, the variable resistance memory device may include a plurality of anti-fuses disposed in the first direction.

Hereinafter, the layout of the anti-fuse will be illustrated with reference to FIGS. 38A, 38B and 38C.

Figure 38A:
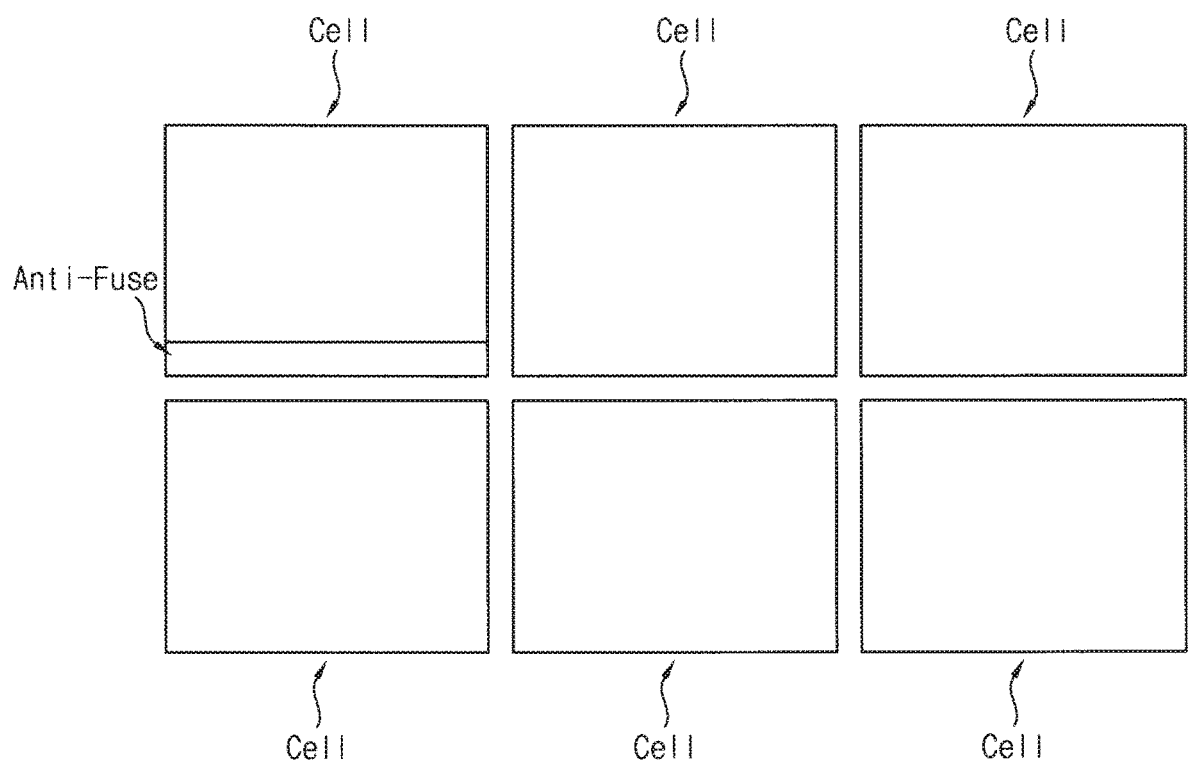
FIGS. 38A, 38B, 38C are plan views illustrating layouts of the anti-fuses in variable resistance memory devices, respectively.
Figure 38A:
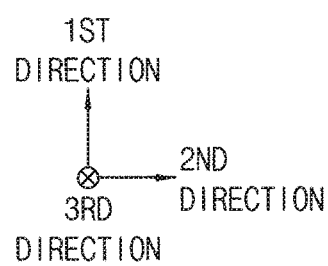
Figure 38B:
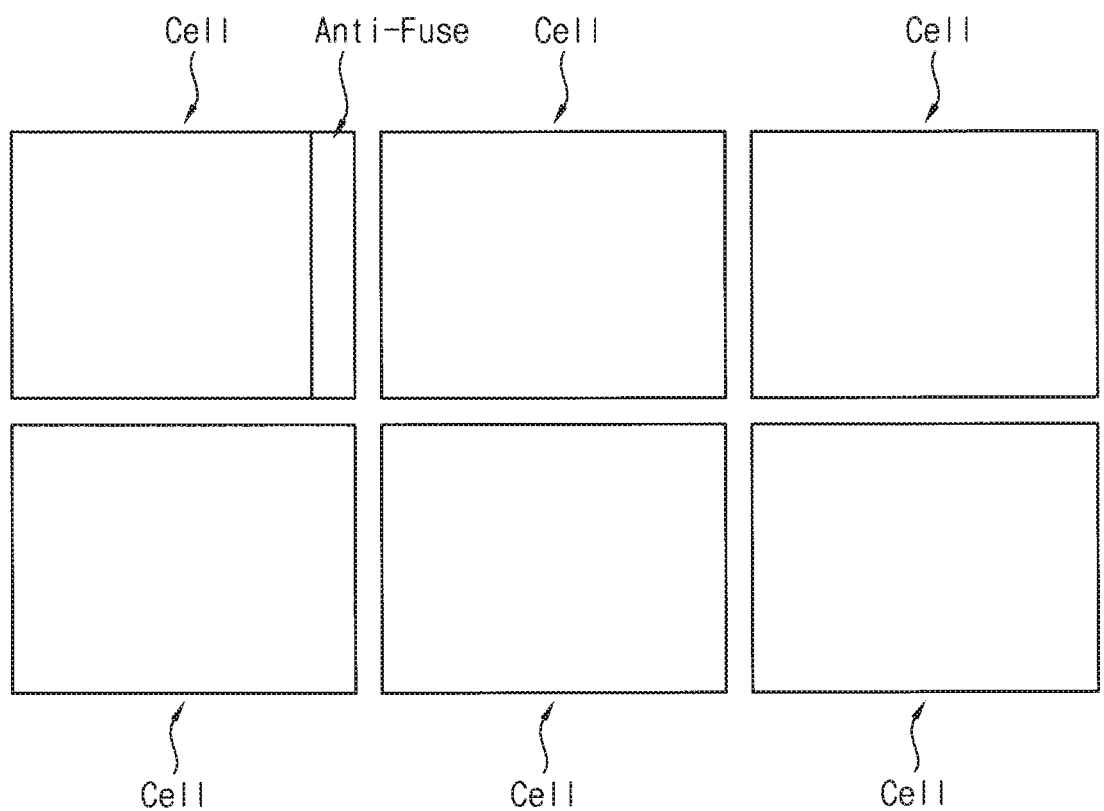
Figure 38C:
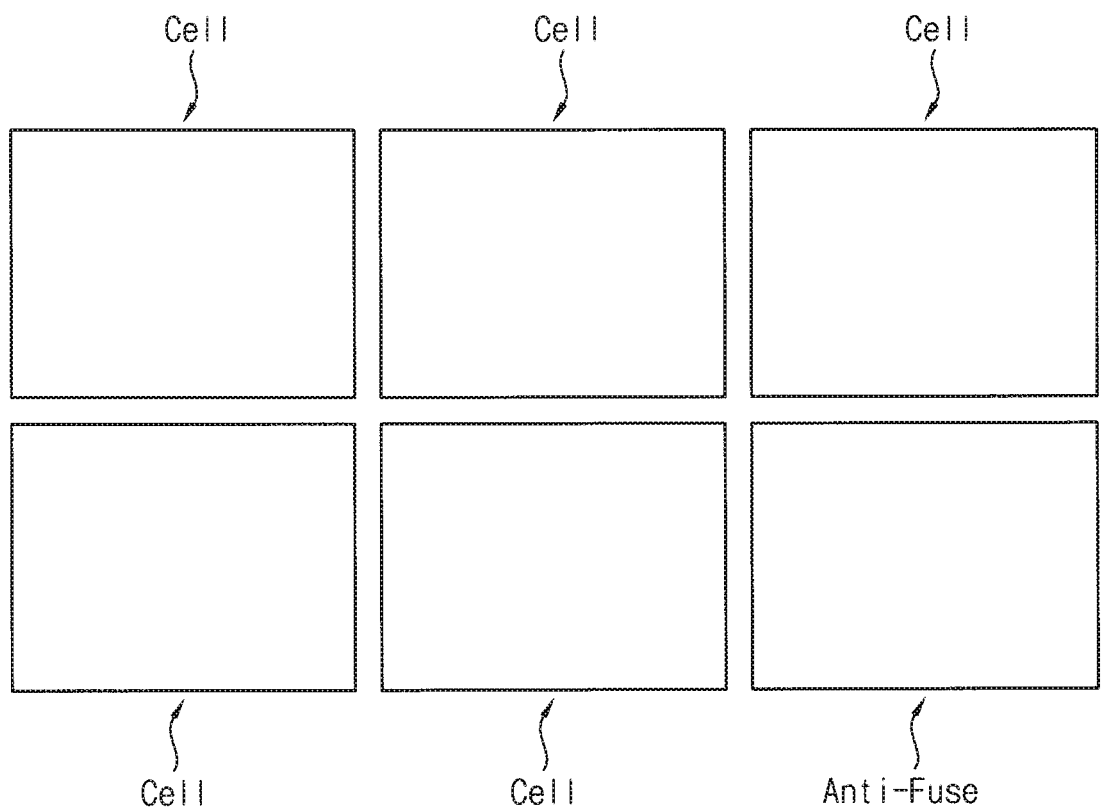

FIGS. 38A, 38B, 38C are plan views illustrating layouts of the anti-fuses in variable resistance memory devices, respectively.

Each of the variable resistance memory devices may include a plurality of cell blocks spaced apart from each other in each of the first and second directions, and in each of the cell blocks, a plurality of regions may be defined between the first and second conductive lines 142 and 372 (refer to FIGS. 28 to 30) extending in the first and second directions, respectively, at which the first and second conductive lines 142 and 372 may cross or intersect each other. A memory unit may be formed at each of the regions, and anti-fuses may be formed at some of the regions.

Referring to FIG. 38A, the anti-fuses may be disposed in the second direction in the cell block.

Referring to FIG. 38B, the anti-fuses may be disposed in the first direction in the cell block.

In FIGS. 38A and 38B, a plurality of anti-fuses are disposed in one direction in one cell block, however, the disposed anti-fuses may not be limited thereto, and the anti-fuses may be disposed in one area of the cell block. Additionally, the anti-fuses may be disposed not in a direction but in a random layout. Further, the anti-fuses may be disposed not in one cell block only but in some of a plurality of cell blocks.

Referring to FIG. 38C, the anti-fuses are disposed in a total area of one of the cell blocks. That is, no memory units may be formed in the one of the cell blocks and only the anti-fuses may be formed therein, and only memory units may be formed in other cell blocks. The anti-fuses only may be also formed in a plurality of cell blocks.

Figure 39:
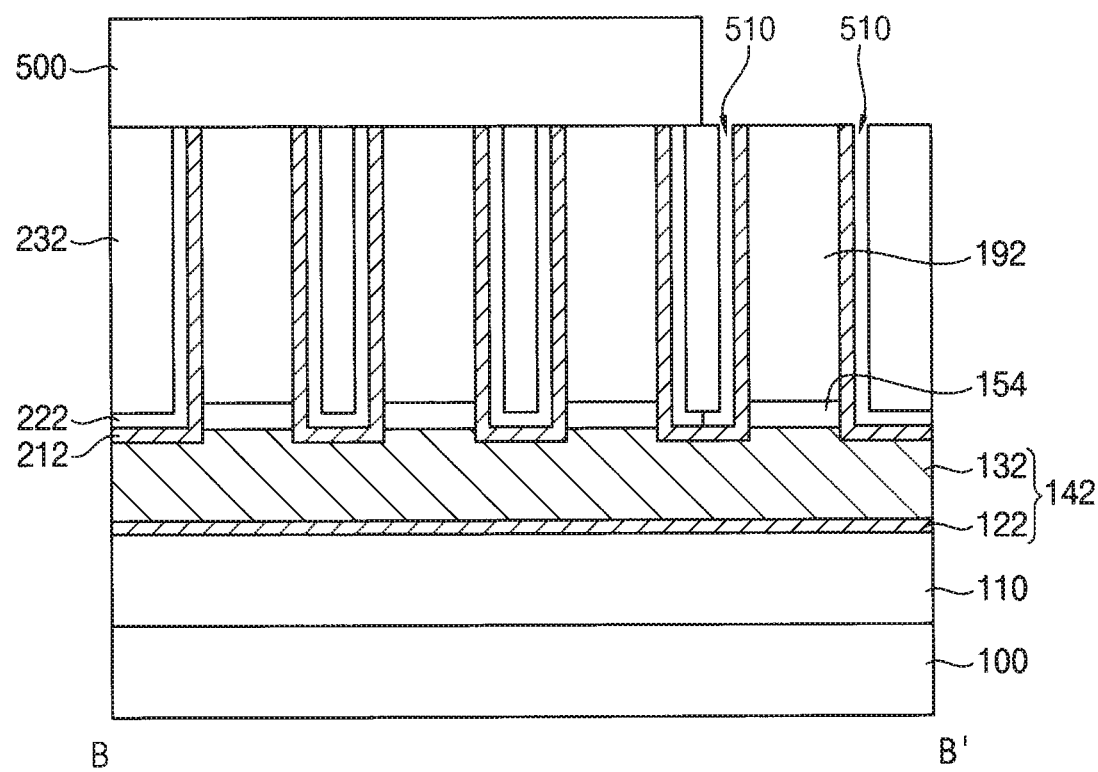
FIGS. 39, 40, and 41 are cross-sectional views illustrating a method of manufacturing a variable resistance memory device in accordance with example embodiments.
Figure 40:
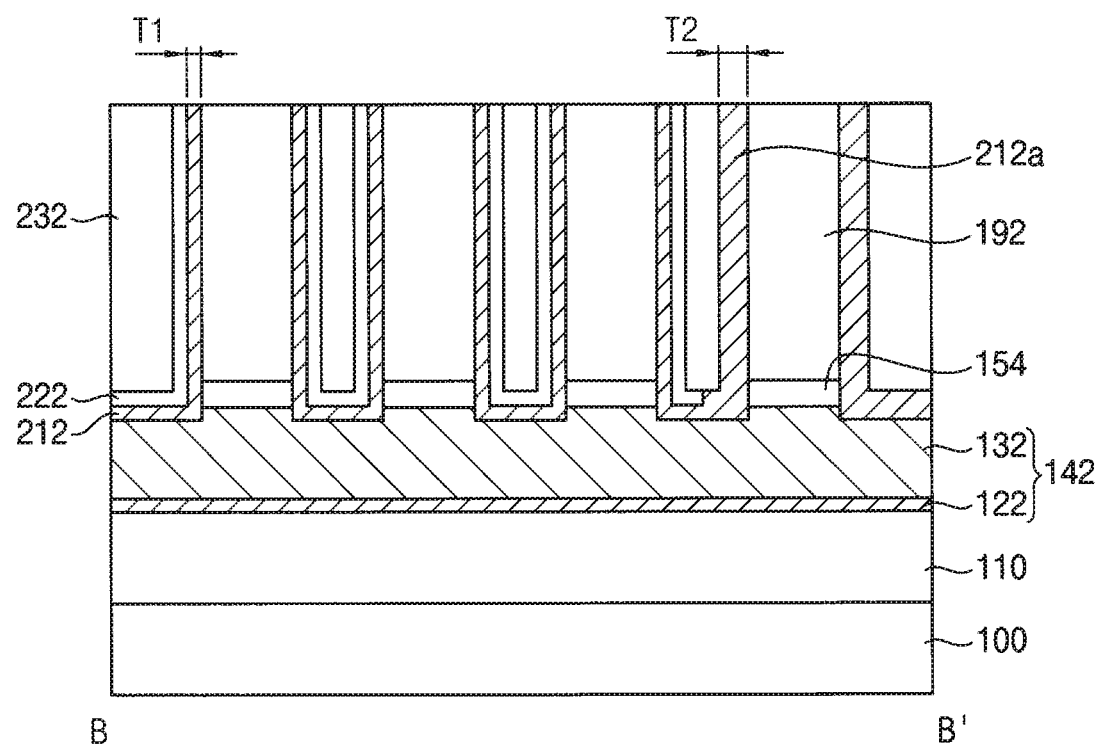
Figure 41:
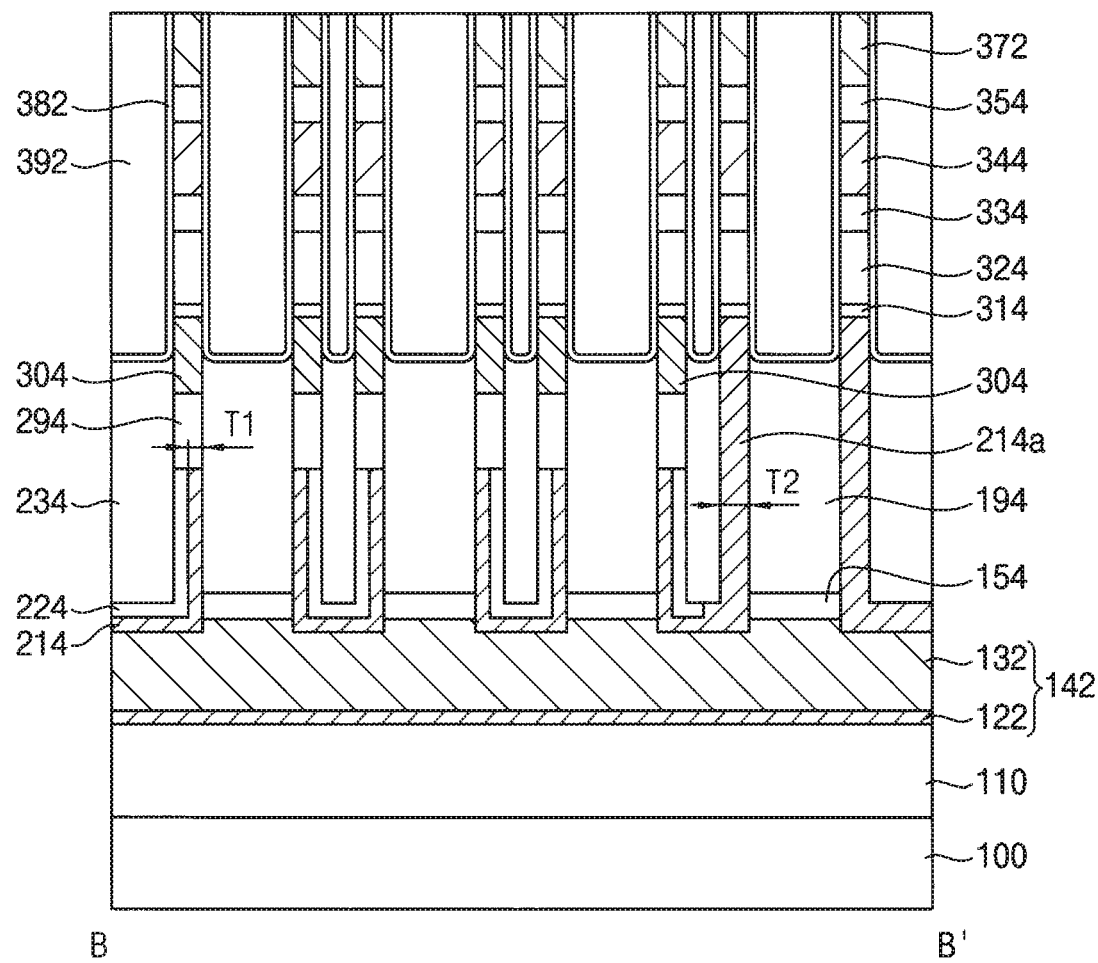
Figure 41:
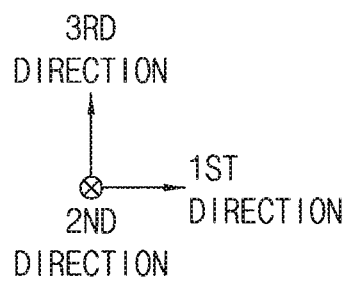

FIGS. 39 to 41 are cross-sectional views illustrating steps of a method of manufacturing a variable resistance memory device in accordance with example embodiments. Specifically, FIGS. 39 to 41 are cross-sectional views taken along lines B-B' of corresponding plan views, respectively.

This method may include processes substantially the same as or similar to those illustrated with reference to FIGS. 1 to 30, and thus detailed descriptions thereon are omitted herein.

Referring to FIG. 39, processes substantially the same as or similar to those illustrated with reference to FIGS. 1 to 10 may be performed.

A seventh etching mask 500 may be formed to cover the fourth insulating interlayer line 232, the spacer line 222, the first electrode line 212, and the third insulating interlayer line 192. The spacer line 222 may be partially removed using the seventh etching mask 500 to form a third recess 510.

In example embodiments, the seventh etching mask 500 may expose an area to be covered by the third etching mask 270 subsequently formed and cover other areas. That is, the seventh etching mask 500 may extend, e.g., in the second direction, and thus may not cover and expose one a plurality of first electrode lines 212 and one or a plurality of spacer lines 222 that may extend in the second direction. Accordingly, the third recess 510 may extend in the second direction, and surfaces of certain first electrode lines 212 may be exposed.

Referring to FIG. 40, thicknesses of the certain first electrode lines 212 of which the surfaces are exposed by the third recess 510 may be increased.

In example embodiments, after removing the seventh etching mask 500, the first electrode layer 210 may be formed on the first electrode line 212, the spacer line 222, and the third and fourth insulating interlayer lines 192 and 232 to fill the third recess 510, and may be planarized until upper surfaces of the third and fourth insulating interlayer lines 192 and 392 may be exposed so that the thicknesses of the certain first electrode lines 212 may be increased.

Accordingly, each of such first electrode lines 212 of which the surfaces are exposed by the third recess 510 may have a second thickness T2 greater than the first thickness T1 of each of other first electrode line 212. Hereinafter, a portion of each of the certain first electrode line 212 having the second thickness T2 may be referred to as a fourth electrode line 212a.

Referring to FIG. 41, processes substantially the same as or similar to those illustrated with reference to FIGS. 11 to 30 may be performed to complete the fabrication of the variable resistance memory device. Thus, the fourth electrode 214a having the second thickness T2 greater than the first thickness T1 of the first electrode 214 may be formed.

Figure 42:
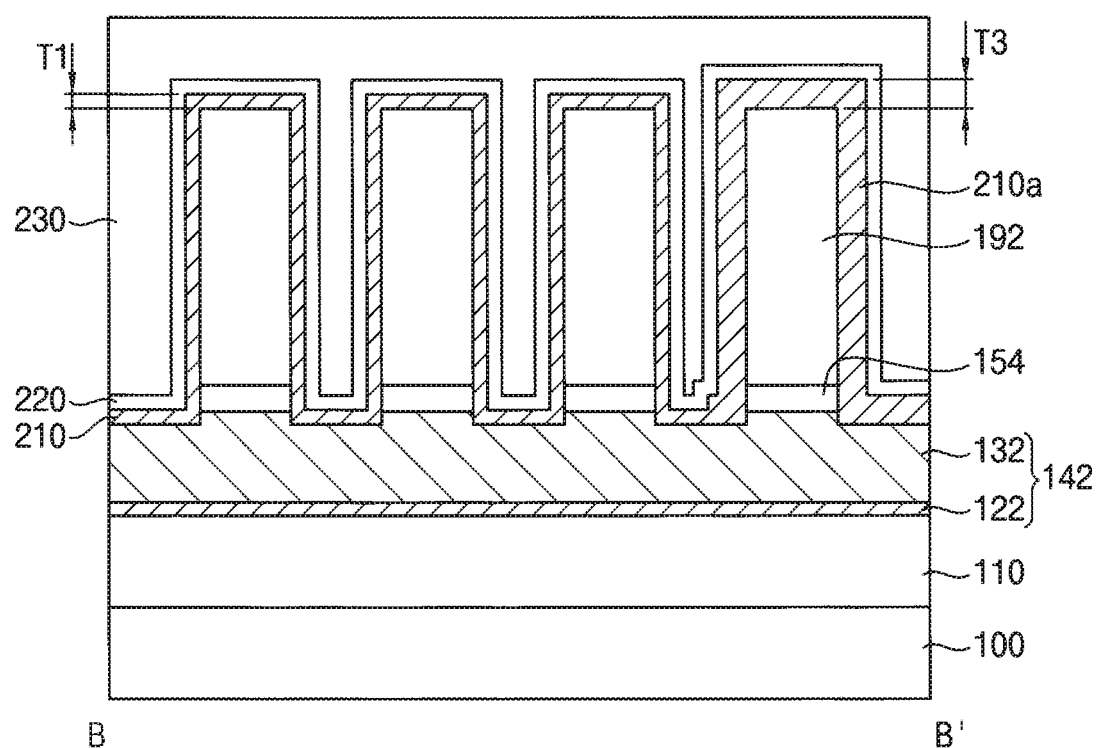
FIGS. 42 and 43 are cross-sectional views illustrating a method of manufacturing a variable resistance memory device in accordance with example embodiments.
Figure 43:
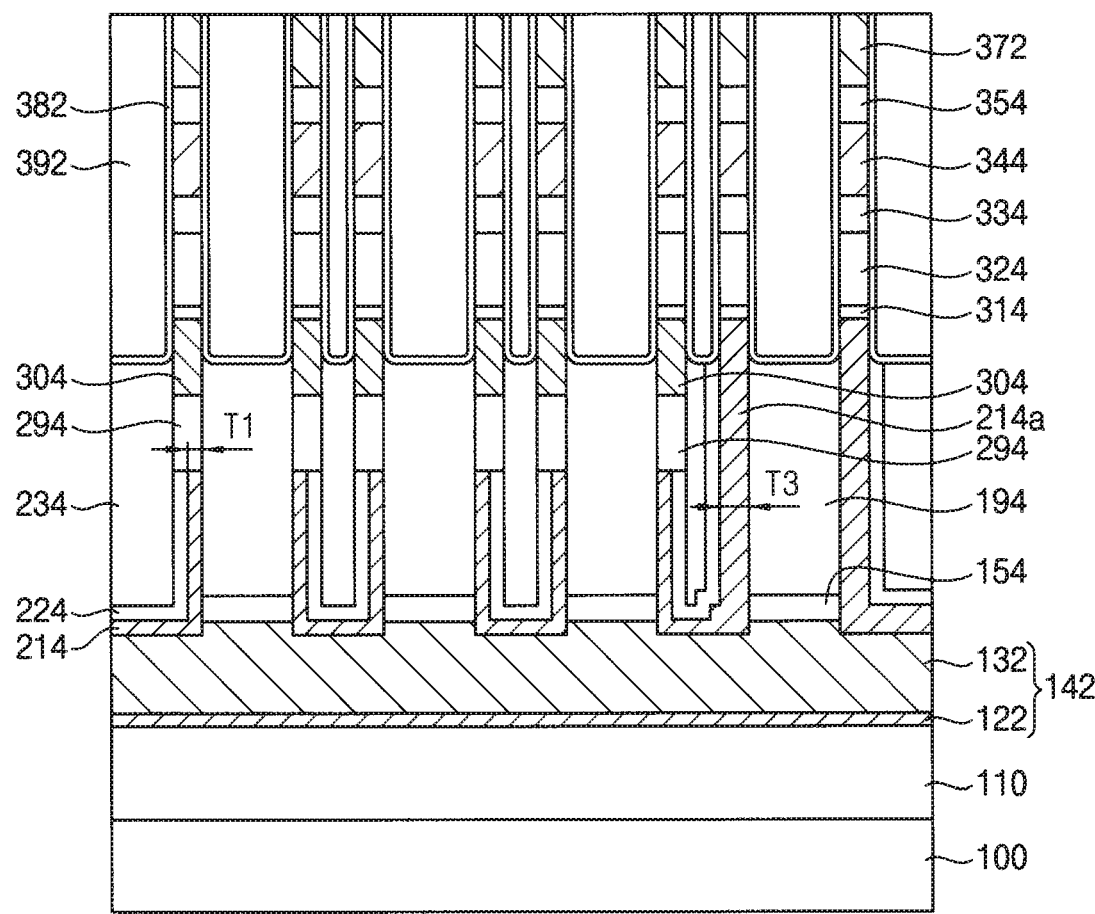
Figure 43:
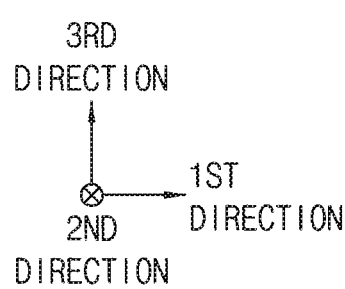

FIGS. 42 and 43 are cross-sectional views illustrating a method of manufacturing a variable resistance memory device in accordance with example embodiments. Specifically, FIGS. 42 and 43 are cross-sectional views taken along lines B-B' of corresponding plan views, respectively.

This method may include processes substantially the same as or similar to those illustrated with reference to FIGS. 1 to 30, and thus redundant descriptions thereon are omitted herein.

Referring to FIG. 42, processes substantially the same as or similar to those illustrated with reference to FIGS. 1 to 6 may be performed.

Thereafter, processes substantially the same as or similar to those illustrated with reference to FIG. 7 may be performed. However, after forming the first electrode layer 210 on the sidewall of the second opening 200, the upper surfaces of the first conductive lines 142 and the second insulating interlayer lines 182 exposed by the second opening 200, and the upper surfaces of the third insulating interlayer lines 192, a blocking pattern exposing an area to be covered by the third etching mask 270 subsequently formed and covering other areas may be formed, and the thickness of the first electrode layer 210 may be increased by a deposition process.

Thus, a portion of the first electrode layer 210 having the blocking pattern thereon may have the first thickness T1, while a portion of the first electrode layer 210 having no blocking pattern thereon may have a third thickness T3 greater than the first thickness T1. Hereinafter, the portion of the first electrode layer 210 having the third thickness T3 may be referred to as a fourth electrode layer 210a.

The spacer layer 220 and the fourth insulating interlayer 230 may be formed on the first electrode layer 210.

Referring to FIG. 43, processes substantially the same as or similar to those illustrated with reference to FIGS. 8 to 30 may be performed to complete the fabrication of the variable resistance memory device. Thus, the fourth electrode 214a having the third thickness T3 greater than the first thickness T1 may be formed.

The above variable resistance memory device may be applied to PRAM devices, ReRAM devices, MRAM devices, etc.

As described above, example embodiments have been described, those skilled in the art will readily appreciate that many modifications are possible in the example embodiments without materially departing from the novel teachings and advantages of the present concepts.

What is claimed is:

1. A variable resistance memory device, comprising:
   a memory unit comprising a first electrode, a variable resistance pattern, and a second electrode, the first electrode, the variable resistance pattern, and the second electrode being sequentially stacked on a substrate;
   a first selection structure disposed on the memory unit for selection via a word line or a bit line of the variable resistance memory device;
   a third electrode structure disposed on the first selection structure; and
   an anti-fuse comprising a fourth electrode, a second selection structure for selection via the word line or the bit line of the variable resistance memory device, and a fifth electrode structure sequentially stacked,
   wherein the memory unit and the anti-fuse are formed in a cell region of the variable resistance memory device.

2. The variable resistance memory device of claim 1, wherein a bottom surface of the fourth electrode is substantially coplanar with a bottom surface of the first electrode.

3. The variable resistance memory device of claim 1, wherein the fourth electrode directly contacts the first electrode.

4. The variable resistance memory device of claim 1, wherein the fourth electrode is comprised of a material substantially the same as a material of the first electrode.

5. The variable resistance memory device of claim 1, wherein an uppermost surface of the fourth electrode is higher than an uppermost surface of the first electrode.

6. The variable resistance memory device of claim 1, wherein a length of the fourth electrode in a vertical direction substantially perpendicular to an upper surface of the substrate is greater than a length of the first electrode in the vertical direction.

7. The variable resistance memory device of claim 1, wherein a cross-section of the first electrode has a U-shape in a direction substantially perpendicular to an upper surface of the substrate, and
wherein the variable resistance pattern and the second electrode are stacked on each of uppermost surfaces of the first electrode.

8. The variable resistance memory device of claim 1, wherein a cross-section of the fourth electrode in a direction substantially perpendicular to an upper surface of the substrate has a U-shape, and
wherein the second selection structure and the fifth electrode structure are stacked on each of uppermost surfaces of the fourth electrode.

9. The variable resistance memory device of claim 1, wherein a length of the fourth electrode in a vertical direction substantially perpendicular to an upper surface of the substrate is substantially equal to a length of the memory unit in the vertical direction.

10. The variable resistance memory device of claim 1, wherein a thickness of the fourth electrode is substantially equal to a thickness of the first electrode.

11. The variable resistance memory device of claim 1, wherein each of the first selection structure and the second selection structure includes a first buffer, a selection pattern and a second buffer sequentially stacked.

12. The variable resistance memory device of claim 1, further comprising:
first conductive lines disposed in a second direction substantially parallel to an upper surface of the substrate, each of the first conductive lines extending in a first direction substantially parallel to the upper surface of the substrate, the second direction crossing the first direction; and
second conductive lines disposed in the first direction over the first conductive lines, each of the second conductive lines extending in the second direction,
wherein the memory unit is formed at each of first regions among regions between the first and second conductive lines, the regions being regions at which the first and second conductive lines overlap with each other in a third direction substantially perpendicular to the upper surface of the substrate, and
wherein the anti-fuse is formed at a second region among the regions.

13. The variable resistance memory device of claim 1, wherein the fourth electrode directly contacts the second selection structure, and a bottom surface of the fourth electrode is lower than a bottom surface of the second electrode.

14. The variable resistance memory device of claim 5, wherein the uppermost surface of the fourth electrode is substantially coplanar with an upper surface of the second electrode.

15. The variable resistance memory device of claim 7, wherein the uppermost surface of the first electrode directly contacts a bottom surface of the variable resistance pattern and has an area smaller than an area of the bottom surface of the variable resistance pattern.

16. The variable resistance memory device of claim 11, wherein the selection pattern includes an ovonic threshold switch (OTS) material containing germanium (Ge), silicon (Si), arsenic (As) and tellurium (Te).

17. The variable resistance memory device of claim 12, wherein the regions are disposed in each of the first and second directions, and a plurality of second regions is disposed in one of the first and second directions, and
the anti-fuse is formed at each of the plurality of second regions.

18. A variable resistance memory device, comprising:
first conductive lines disposed on a substrate in a second direction parallel to an upper surface of the substrate, each of the first conductive lines extending in a first direction substantially parallel to the upper surface of the substrate, the second direction crossing the first direction;
second conductive lines disposed in the first direction over the first conductive lines, each of the second conductive lines extending in the second direction;
memory units at first regions, respectively, among regions between the first and second conductive lines, the regions being regions at which the first and second conductive lines overlap with each other in a third direction substantially perpendicular to the upper surface of the substrate, and each of the memory units including a first electrode, a variable resistance pattern, and a second electrode sequentially stacked;
a first selection structure disposed on each of the memory units for selection via a word line or a bit line of the variable resistance memory device;
a third electrode structure on the first selection structure; and
an anti-fuse at a second region among the regions, the anti-fuse comprising a fourth electrode, a second selection structure for selection via the word line or the bit line of the variable resistance memory device, and a fifth electrode structure sequentially stacked,
wherein a length of the fourth electrode in the third direction is greater than a length of the first electrode in the third direction.

19. The variable resistance memory device of claim 18, wherein a bottom surface of the fourth electrode is substantially coplanar with a bottom surface of the first electrode, and an uppermost surface of the fourth electrode is substantially coplanar with an upper surface of the second electrode.

20. The variable resistance memory device of claim 18, wherein the second selection structure directly contacts the fourth electrode.

* * * * *